(12) United States Patent
Yu et al.

(10) Patent No.: US 12,733,234 B2
(45) Date of Patent: Sep. 8, 2026

(54) METHOD OF FORMING A NANO-FET SEMICONDUCTOR DEVICE

(71) Applicant: Taiwan Semiconductor Manufacturing Co., Ltd., Hsinchu (TW)

(72) Inventors: Li-Chi Yu, Jhubei (TW); Cheng-I Chu, Taipei (TW); Chia-Hsuan Wang, Hsinchu (TW); Chen-Fong Tsai, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 238 days.

(21) Appl. No.: 18/151,761

(22) Filed: Jan. 9, 2023

(65) Prior Publication Data

US 2023/0163198 A1 May 25, 2023

Related U.S. Application Data

(63) Continuation-in-part of application No. 17/322,405, filed on May 17, 2021, now Pat. No. 12,040,382.

(Continued)

(51) Int. Cl.
*H10D 64/01* (2025.01)
*H10D 30/01* (2025.01)

(Continued)

(52) U.S. Cl.
CPC ......... *H10D 64/021* (2025.01); *H10D 30/014* (2025.01); *H10D 30/43* (2025.01);

(Continued)

(58) Field of Classification Search
CPC .... H10D 64/021; H10D 30/014; H10D 30/43; H10D 30/6735; H10D 30/6757; H10D 62/121; H10D 62/151; H10D 64/017; H10D 84/0128; H10D 84/013; H10D 84/0147; H10D 84/038; H10D 30/797;

(Continued)

(56) References Cited

U.S. PATENT DOCUMENTS 6,483,154 B1 * 11/2002 Ngo .................. H10D 30/0212 257/388
9,209,247 B2 12/2015 Colinge et al.

(Continued)

FOREIGN PATENT DOCUMENTS

CN 105489605 A 4/2016
CN 109216197 A 1/2019

(Continued)

*Primary Examiner* — Brian Turner
*Assistant Examiner* — Zhijun Xu
(74) *Attorney, Agent, or Firm* — Slater Matsil, LLP

(57) ABSTRACT

Embodiments include nanostructure devices and methods of forming nanostructure devices which include a treatment process to expand a sidewall spacer material to close a seam in the sidewall spacer material after deposition. The treatment process includes oxygen plasma treatment to expand the sidewall spacer material and crosslink the open seam to form a closed seam, lower k-value, and decrease density.

20 Claims, 53 Drawing Sheets

Related U.S. Application Data

(60) Provisional application No. 63/420,392, filed on Oct. 28, 2022, provisional application No. 63/148,646, filed on Feb. 12, 2021.

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |

(52) U.S. Cl.
CPC ..... *H10D 30/6735* (2025.01); *H10D 30/6757* (2025.01); *H10D 62/121* (2025.01); *H10D 62/151* (2025.01); *H10D 64/017* (2025.01); *H10D 84/0128* (2025.01); *H10D 84/013* (2025.01); *H10D 84/0147* (2025.01); *H10D 84/038* (2025.01)

(58) Field of Classification Search
CPC ............. H10D 62/822; H10D 84/0167; H10D 84/0184; H10D 64/251; H01L 21/02126; H01L 21/02211; H01L 21/0228; H01L 21/0234; H01L 21/3105; H01L 21/3115; H01L 21/02326; B82Y 10/00; H10P 14/6522; H10P 14/6339; H10P 14/6532; H10P 14/6682; H10P 14/6922; H10P 32/20; H10P 95/00
See application file for complete search history.

(56) References Cited

U.S. PATENT DOCUMENTS

| | | | | |
|---|---|---|---|---|
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2004/0256664 | A1* | 12/2004 | Chou | H10D 64/693 438/257 |
| 2016/0071757 | A1 | 3/2016 | Tsai et al. | |
| 2017/0053998 | A1 | 2/2017 | Kim | |
| 2018/0151690 | A1* | 5/2018 | Han | H10D 30/62 |
| 2018/0294151 | A1* | 10/2018 | Doris | H01L 29/0673 |
| 2019/0006485 | A1 | 1/2019 | Kim et al. | |
| 2019/0067122 | A1 | 2/2019 | Cheng et al. | |
| 2019/0148501 | A1 | 5/2019 | Chen | |
| 2020/0006577 | A1* | 1/2020 | Ching | H01L 21/0262 |
| 2020/0075743 | A1 | 3/2020 | Lee et al. | |
| 2020/0185539 | A1 | 6/2020 | Lee et al. | |
| 2020/0303521 | A1 | 9/2020 | Son et al. | |
| 2020/0411661 | A1 | 12/2020 | Guler et al. | |
| 2022/0123152 | A1 | 4/2022 | Abhijith et al. | |
| 2022/0336637 | A1 | 10/2022 | Kao et al. | |

FOREIGN PATENT DOCUMENTS

| | | | |
|---|---|---|---|
| CN | 109427901 | A | 3/2019 |
| CN | 111725315 | A | 9/2020 |
| DE | 102017119616 | A1 | 11/2018 |
| DE | 102020113776 | A1 | 12/2020 |
| KR | 20030052663 | A | 6/2003 |
| KR | 20190002005 | A | 1/2019 |
| KR | 20190024625 | A | 3/2019 |

* cited by examiner

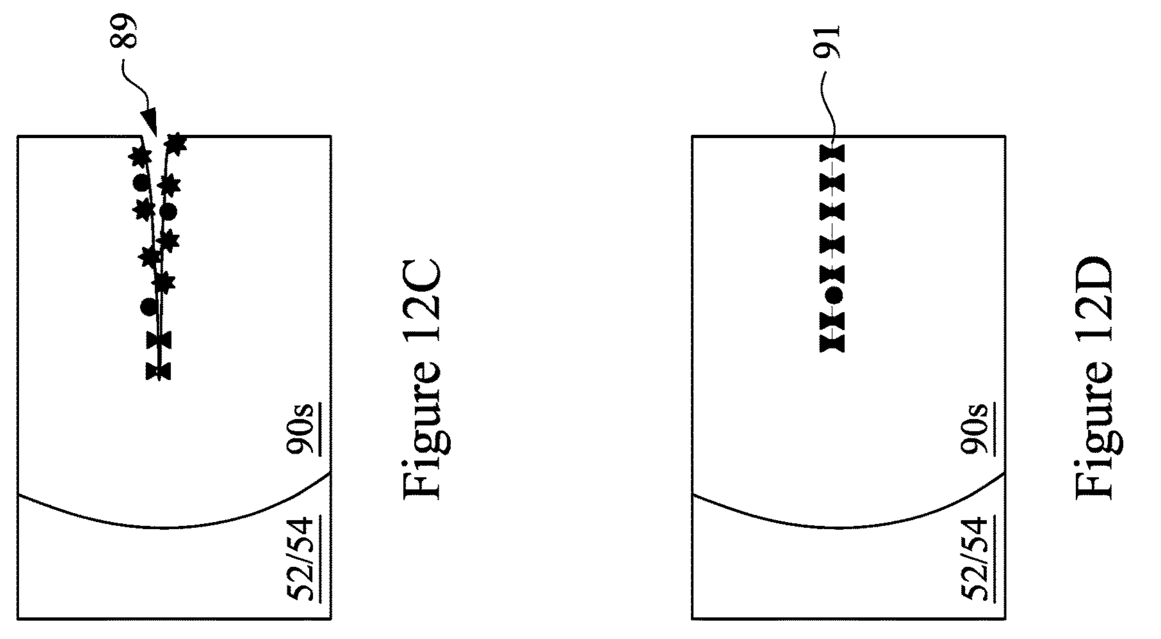
Figure 12C
Figure 12D
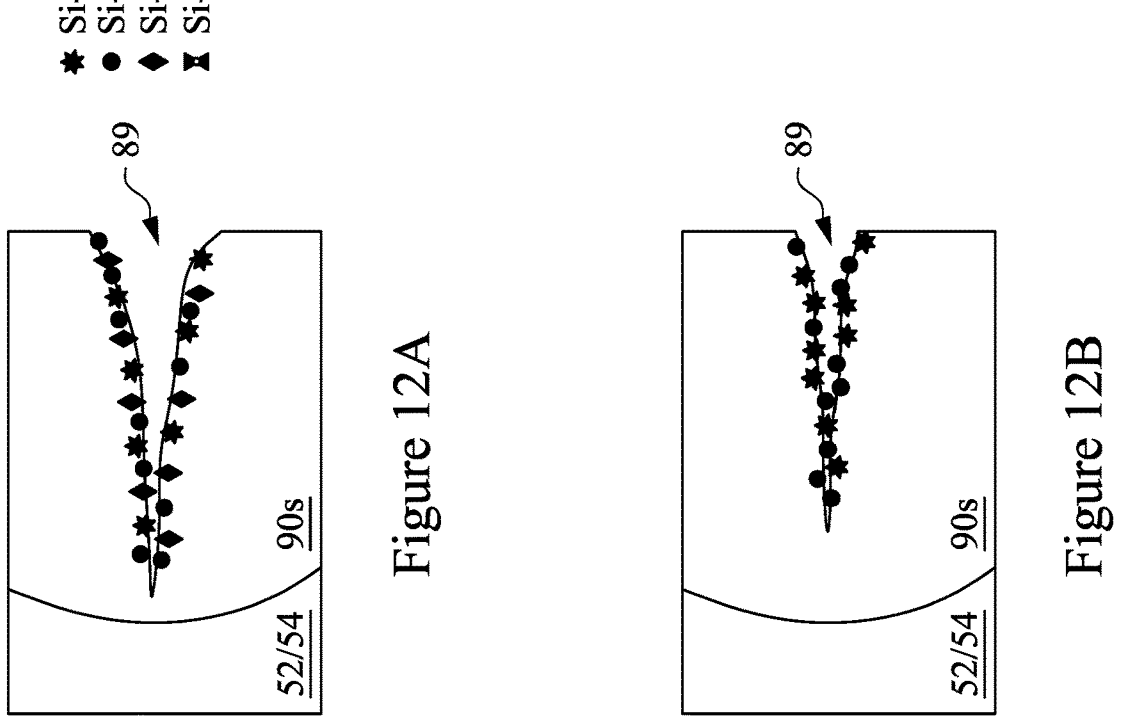
Figure 12A
Figure 12B

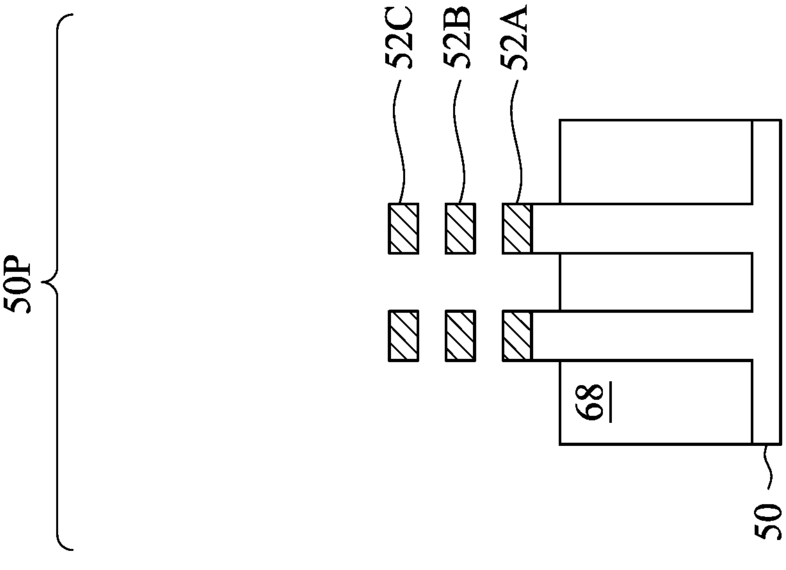
Figure 22A
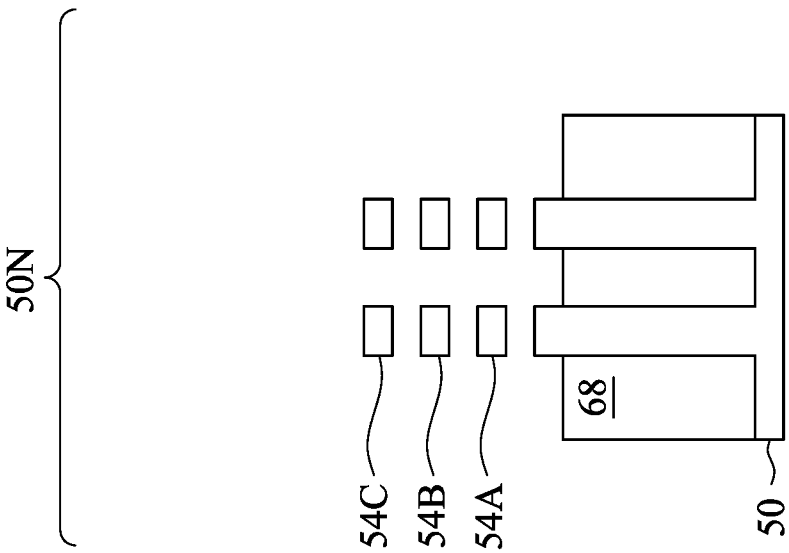

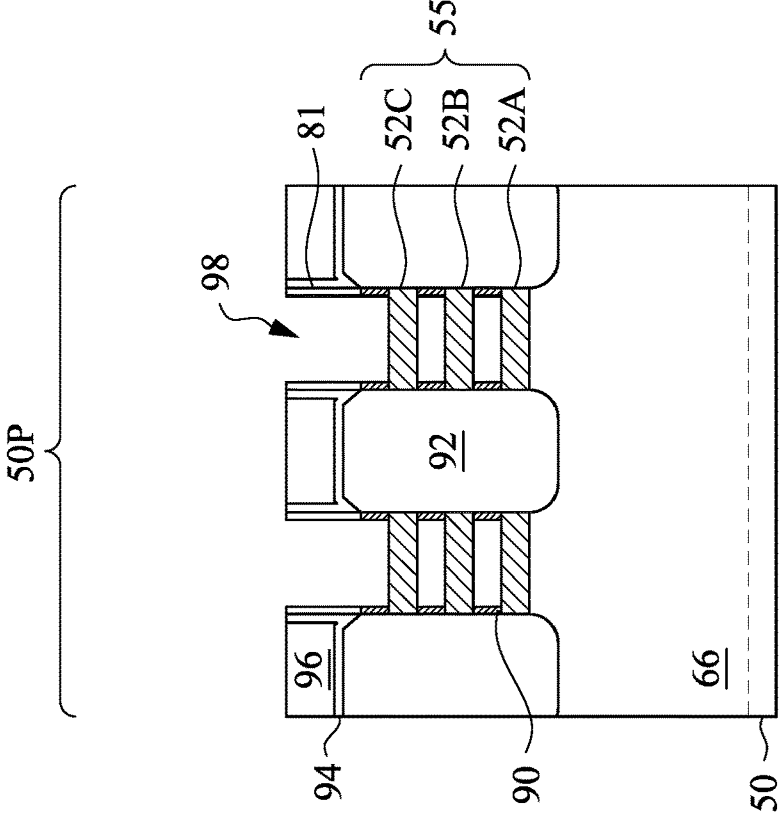
Figure 22B
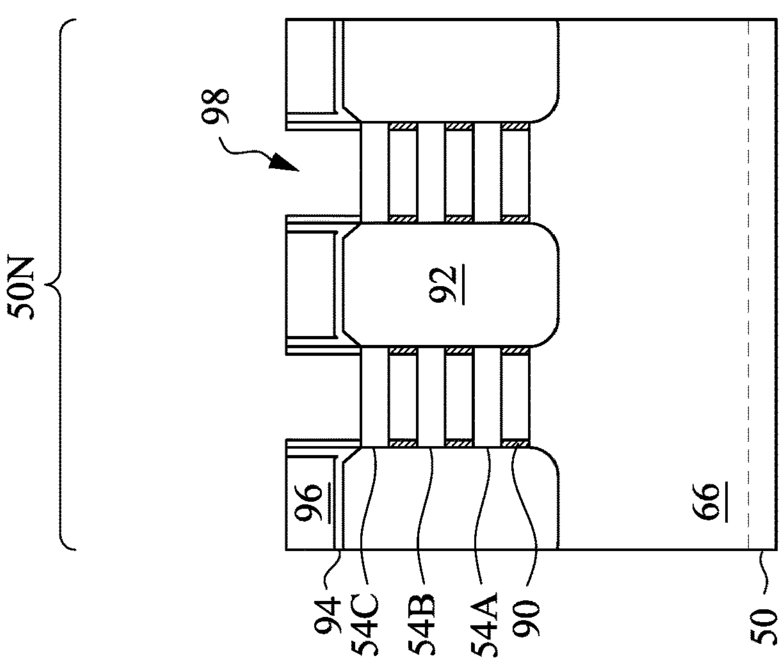

METHOD OF FORMING A NANO-FET SEMICONDUCTOR DEVICE

PRIORITY CLAIM AND CROSS-REFERENCE

This application is a continuation-in-part of U.S. application Ser. No. 17/322,405, filed on May 17, 2021 (which claims priority to U.S. Provisional Application No. 63/148,646, filed on Feb. 12, 2021), and claims priority to U.S. Provisional Application No. 63/420,392, filed on Oct. 28, 2022, which applications are hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 10C, 11A, 11B, 11C, 12A, 12B, 12C, 12C, 12D, 13A, 13B, 14A, 15, 16A, 16B, 17A, 17B, 18A, 18B, 18C, 19A, 19B, 19C, 20A, 20B, 21A, 21B, 22A, 22B, 23A, 23B, 24A, 24B, 24C, 25A, 25B, 25C, 26A, 26B, and 26C are cross-sectional views of intermediate stages in the manufacturing of nano-FETs, in accordance with some embodiments.

DETAILED DESCRIPTION

Figure 1:
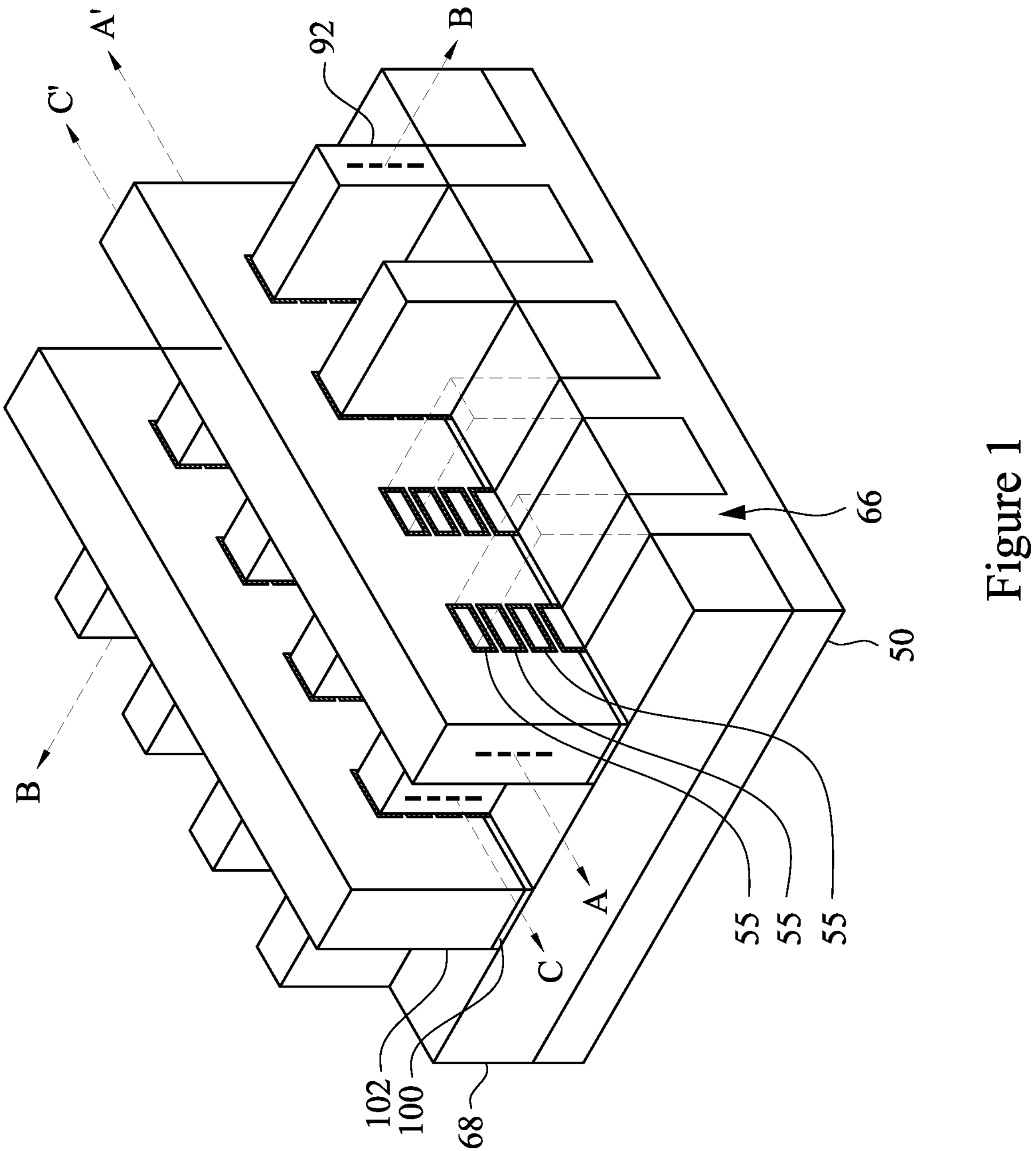
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

Embodiments of the present disclosure advantageously perform a process to a sidewall spacer of a nano-FET to reduce or eliminate a seam that can form in the spacer and to reduce or eliminate dishing of the sidewall spacer. Embodiments also provide an radical oxidation treatment to oxidize an outer layer of the sidewall spacer layer, to provide a complex oxidation profile for better etching when forming inner sidewall spacers. In the formation of nano-FETs, sidewall spacers may be used between the source/drain epitaxial regions and the gate structures. After recesses are formed for the source/drain epitaxial regions, the nanostructures are etched laterally to recess the sides of the nanostructures. This etching can cause dishing of the nanostructure sidewall recesses. Then, a spacer is deposited in the sidewall recesses. In some cases, when the spacer is deposited, a seam may occur between the top of the spacer and the bottom of the spacer due to the conformal deposition used to form the spacer layer. Embodiments advantageously process the spacer layer to provide a complex etch resistivity for the spacer to aid in the etching into the sidewall spacers. Embodiments also reduce or eliminate the seam and to reduce or eliminate the dishing of the sidewall spacer. As a result $C_{eff}$ of the transistor is improved and an AC performance boost is realized.

FIG. 1 illustrates an example of nano-FETs (e.g., nanowire FETs, nanosheet FETs (NSFETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term “substrate” may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102. Source/drain region(s) may refer to a source or a drain, individually or collectively dependent upon the context.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 26C are cross-sectional views of intermediate stages in the manufacturing of nano-FETs, in accordance with some embodiments. FIGS. 2 through 5, 6A, 19A, 20A, 21A, 22A, 23A, 24A, 25A, 26A, and 27A illustrate reference cross-section A-A' illustrated in FIG. 1. FIGS. 6B, 7B, 8B, 9B, 10B, 10C, 11B, 11C, 12A, 12B, 12C, 12D, 13A, 13B, 14A, 15, 16B, 17A, 17B, 18B, 19B, 20B, 21B, 22B, 23B, 24B, 25B, 26B, and 27B illustrate reference cross-section B-B' illustrated in FIG. 1. FIGS. 7A, 8A, 9A, 10A, 11A, 12A, 16A, 17A, 18A, 18C, 19C, 24C, 25C, 26C, and 27C illustrate reference cross-section C-C' illustrated in FIG. 1. FIGS. 27A, 27B, and 27C are cross-sectional views of nano-FETs, in accordance with some embodiments.

Figure 2:
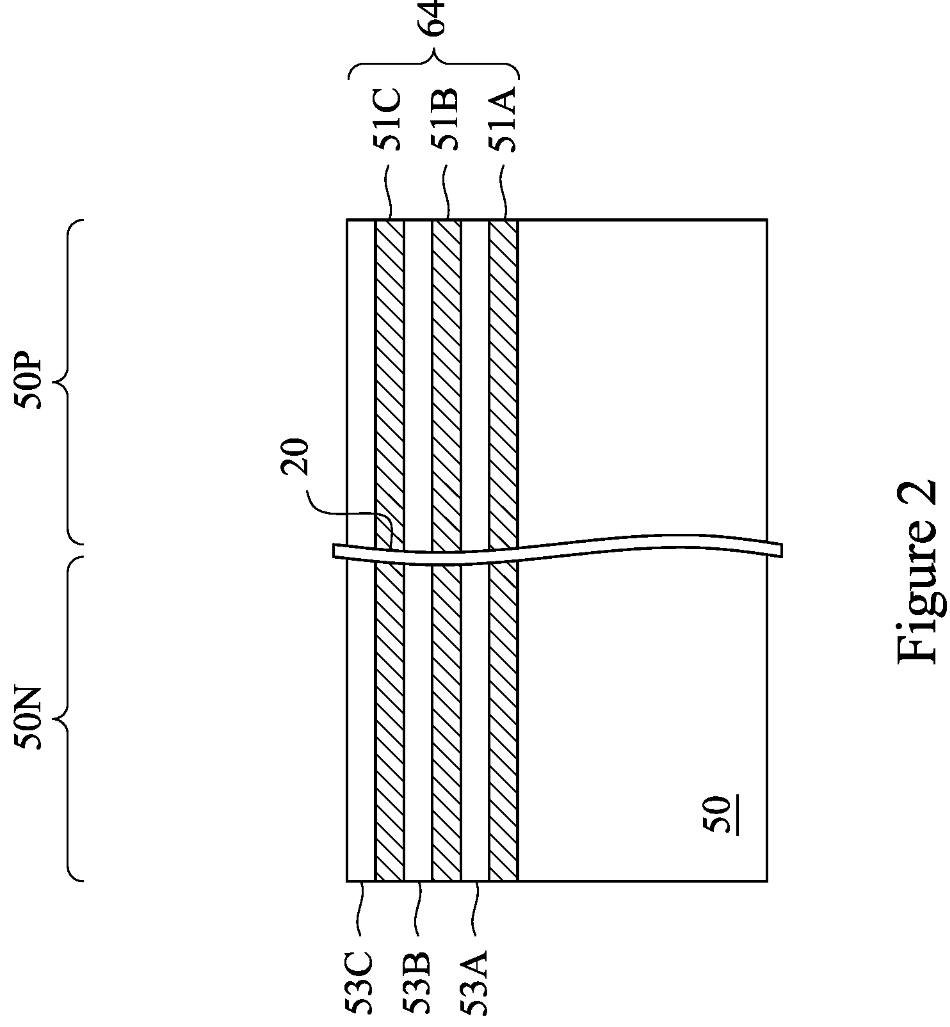

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 27A, 27B, and 27C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
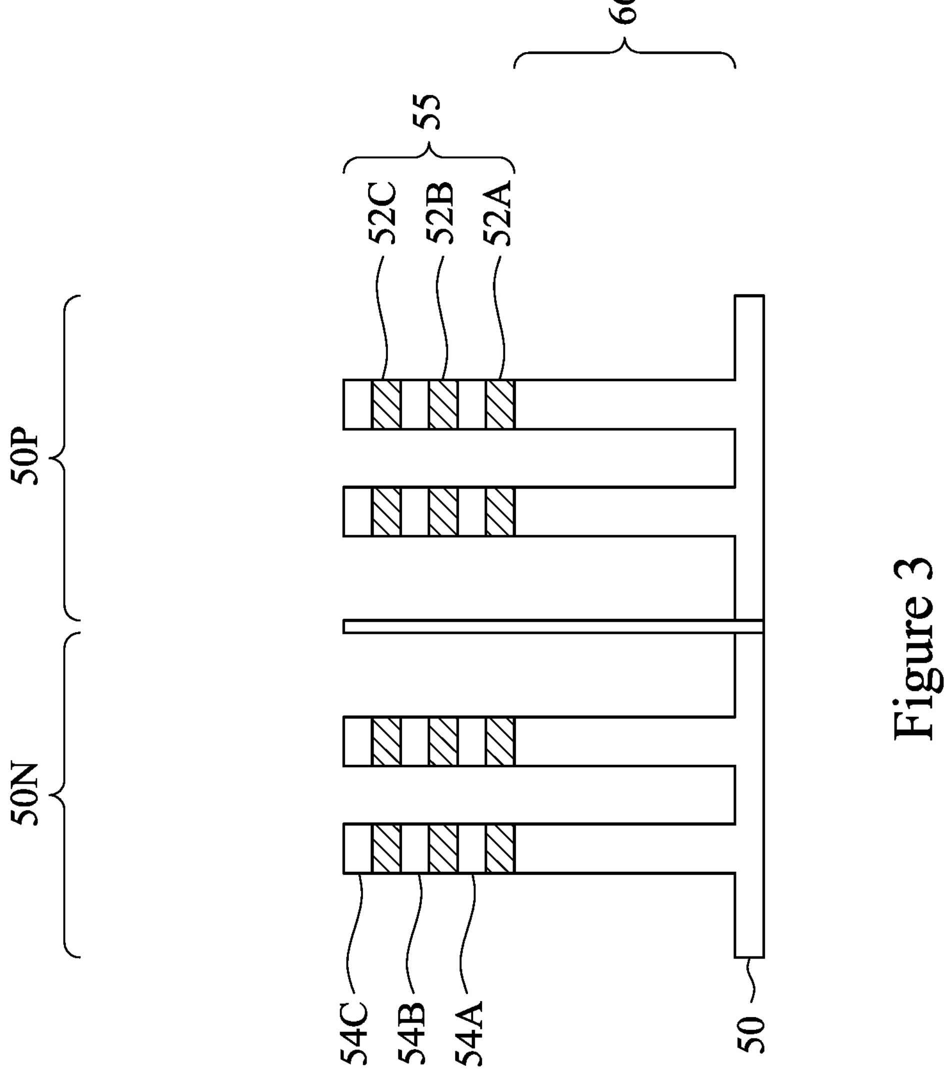

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55. Embodiments described below will use either the first nanostructures 52 or second nanostructures 54 as channel regions extending between two source/drain regions (see, e.g., FIG. 18B). For whichever nanostructures 55 are used as the channel regions, the width of the channel region between the two subsequently formed source/drain regions (the channel width) is greater than the thickness of the nanostructures 55 not used (which are eventually removed), so that the channel width is greater than the vertical distance between two adjacent channels. For example, if the second nanostructures 54 are used as the channels (e.g., 54B and 54C), then the thickness of the first nanostructure 52 (e.g., 52C) between two adjacent ones of the second nanostructures 54 is less than the channel width (e.g., as seen in FIG. 18B) of the second nanostructures 54.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
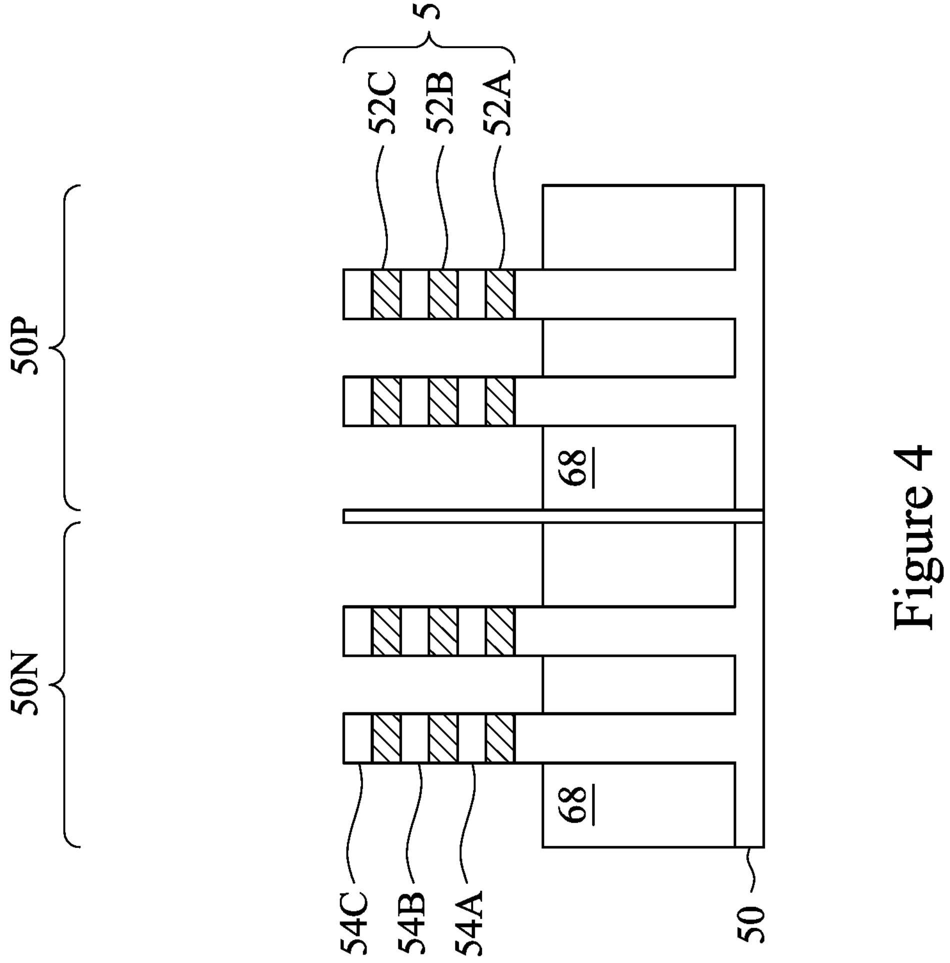

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
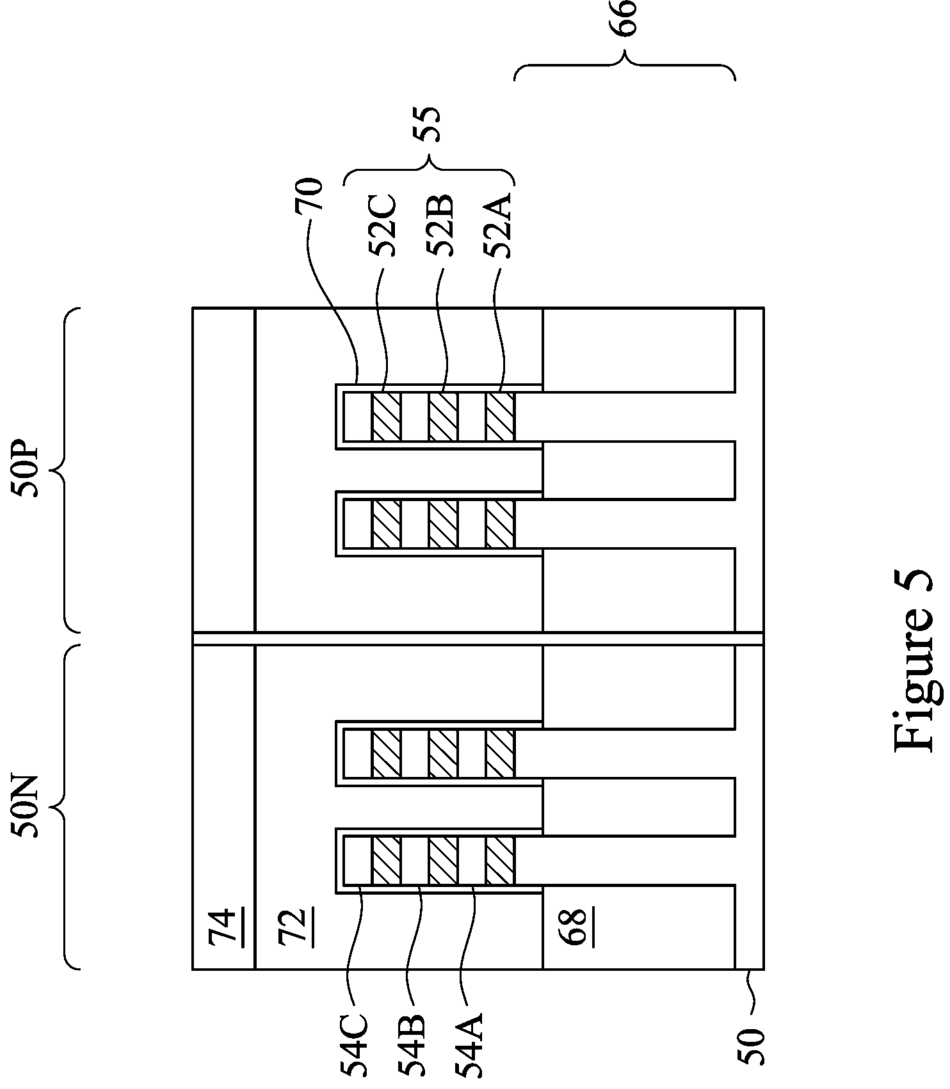

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
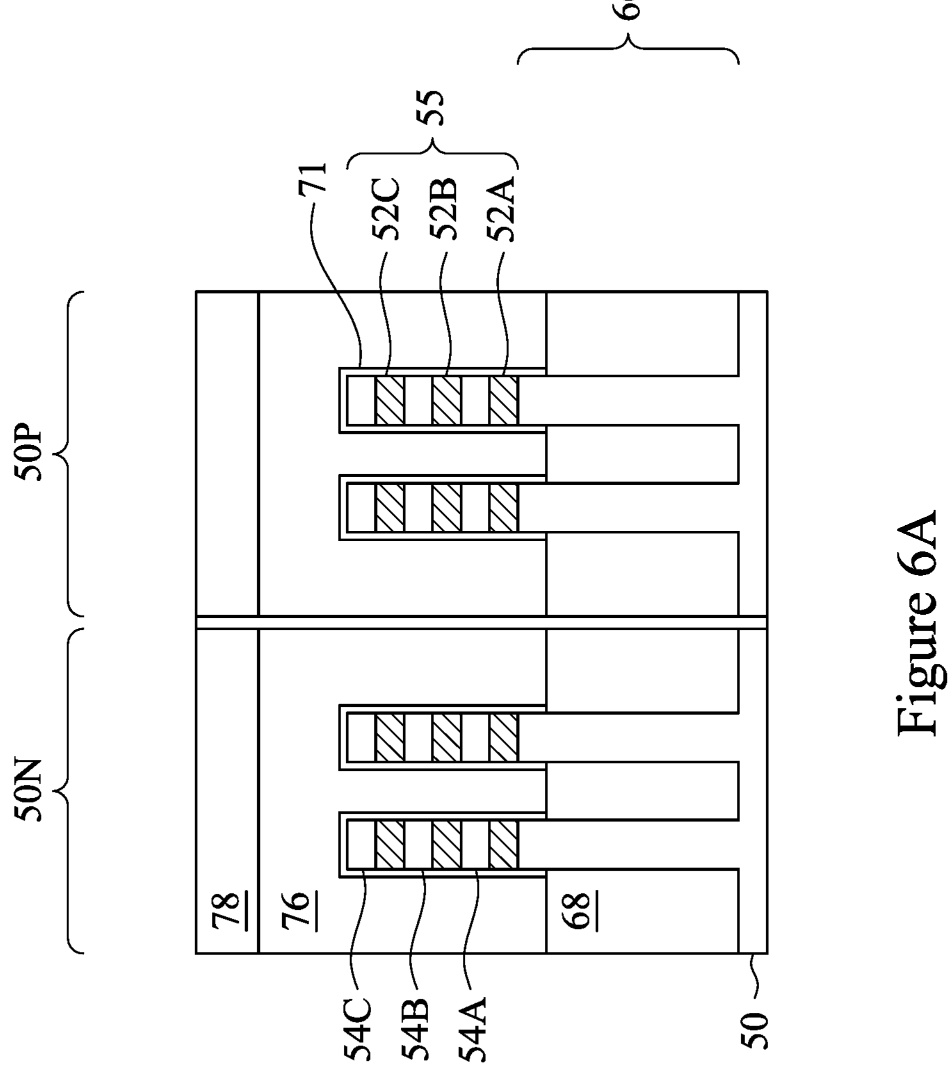
Figure 6B:
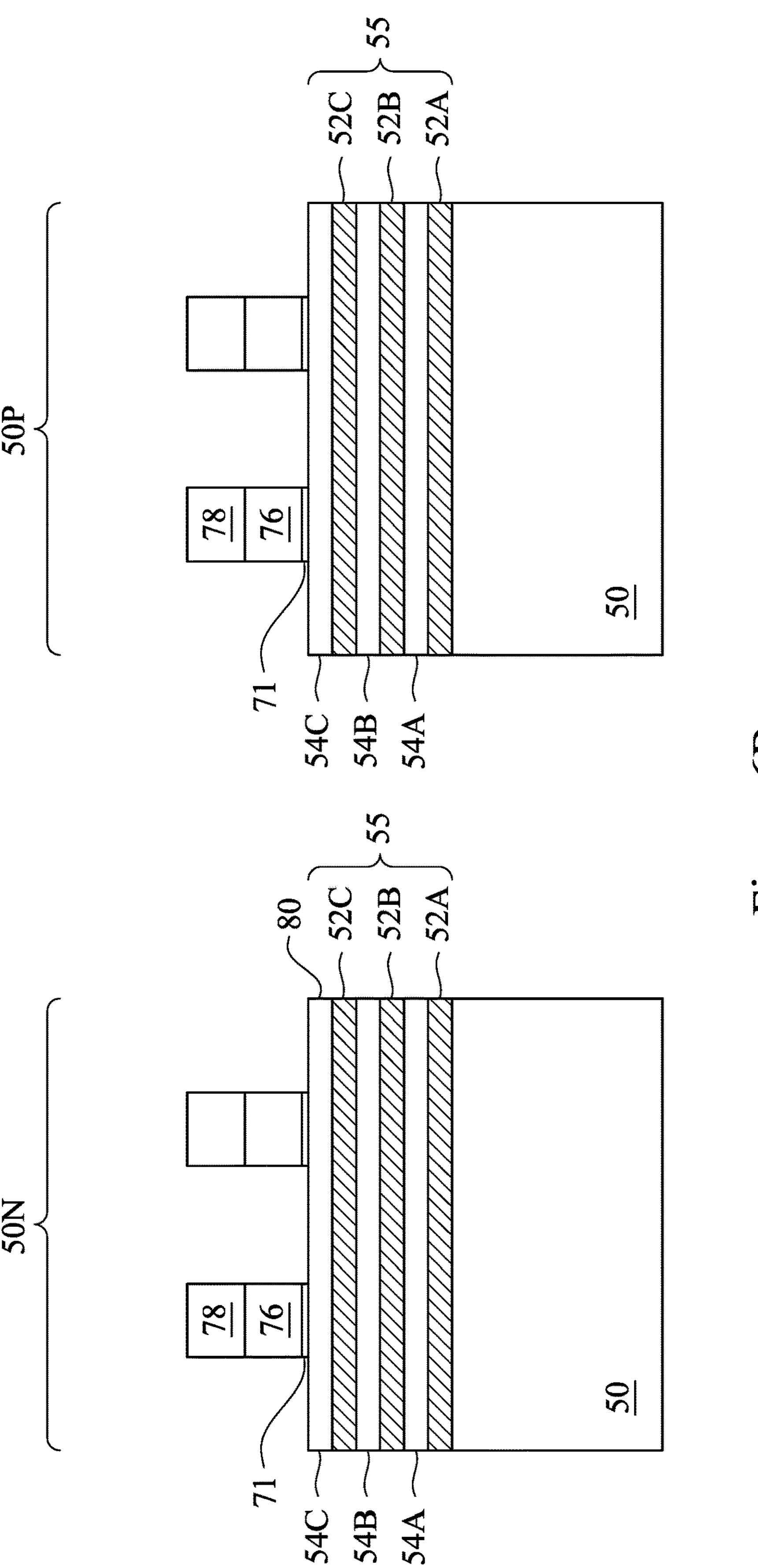

FIGS. 6A through 18C illustrate various additional steps in the manufacturing of embodiment devices. FIGS. 6A, 7A, 8A, 9A, 10A, 11A, 12A, 12C, 13A, 13C, 14A, 15A, and 18C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
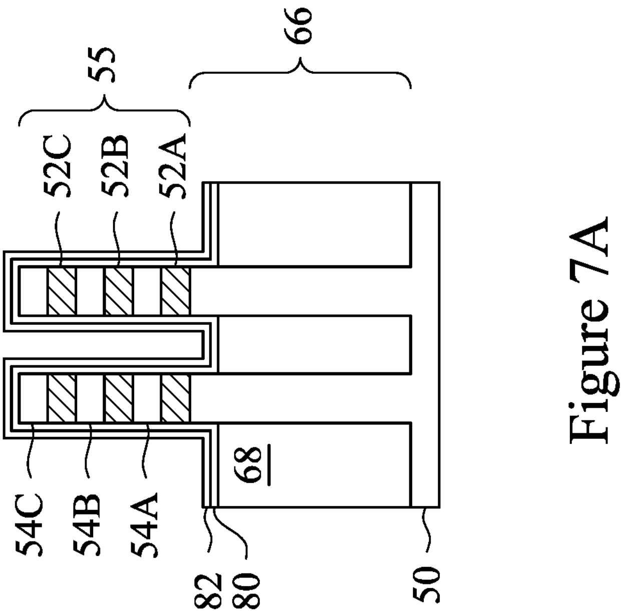
Figure 7B:
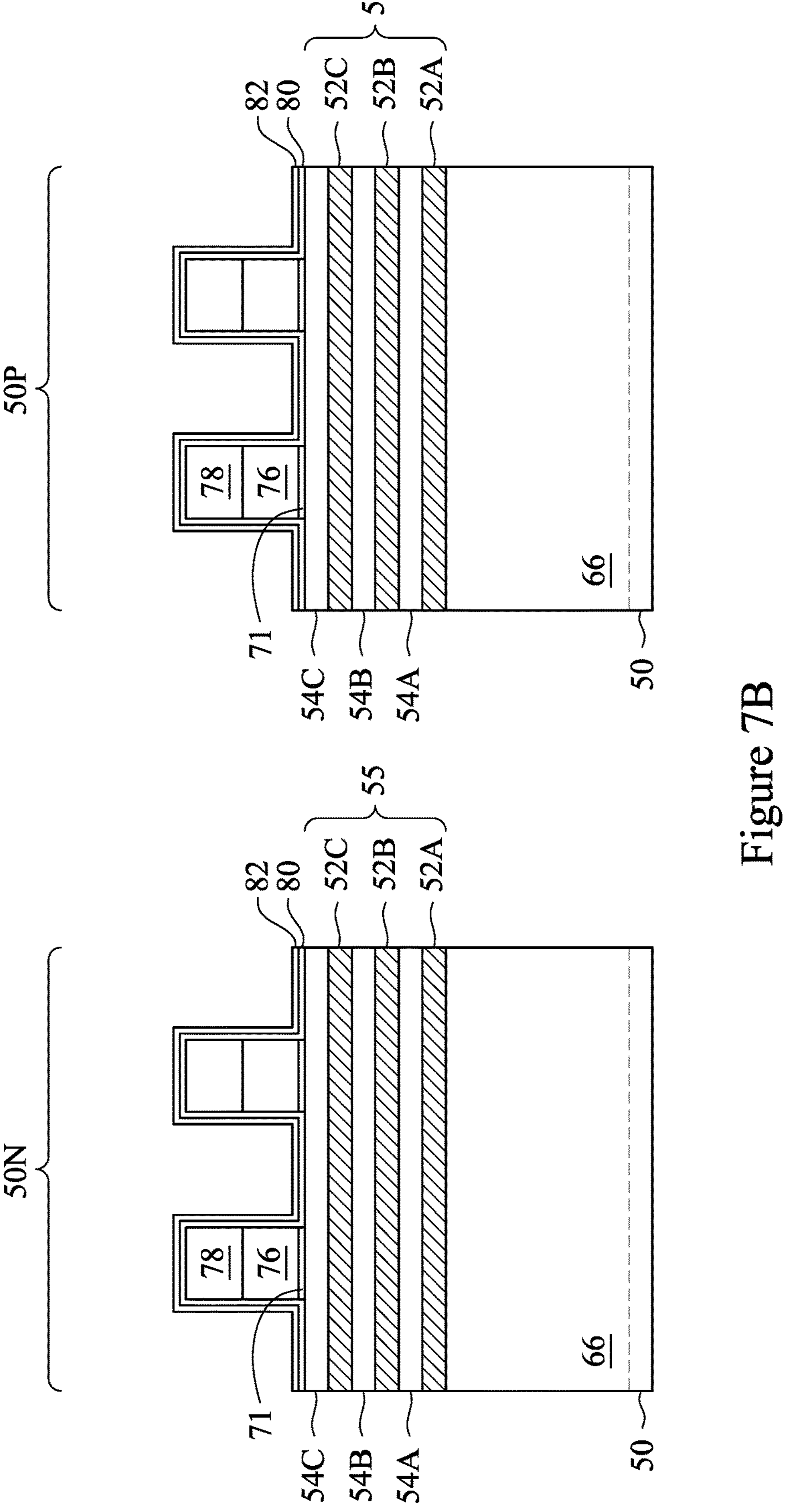

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

Figure 8A:
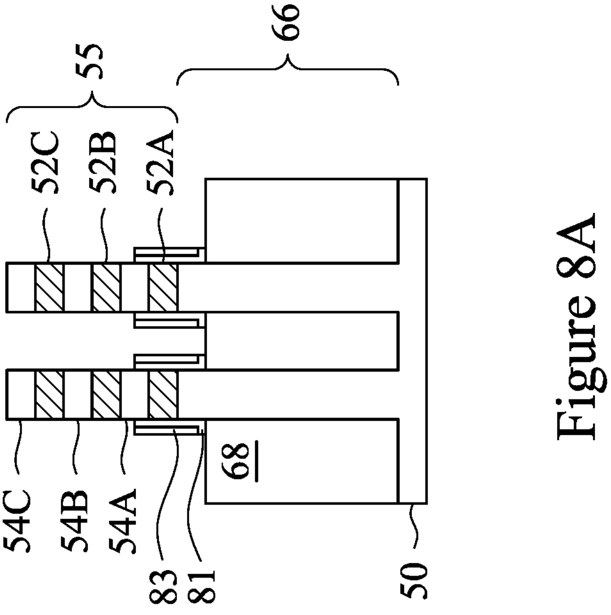
Figure 8B:
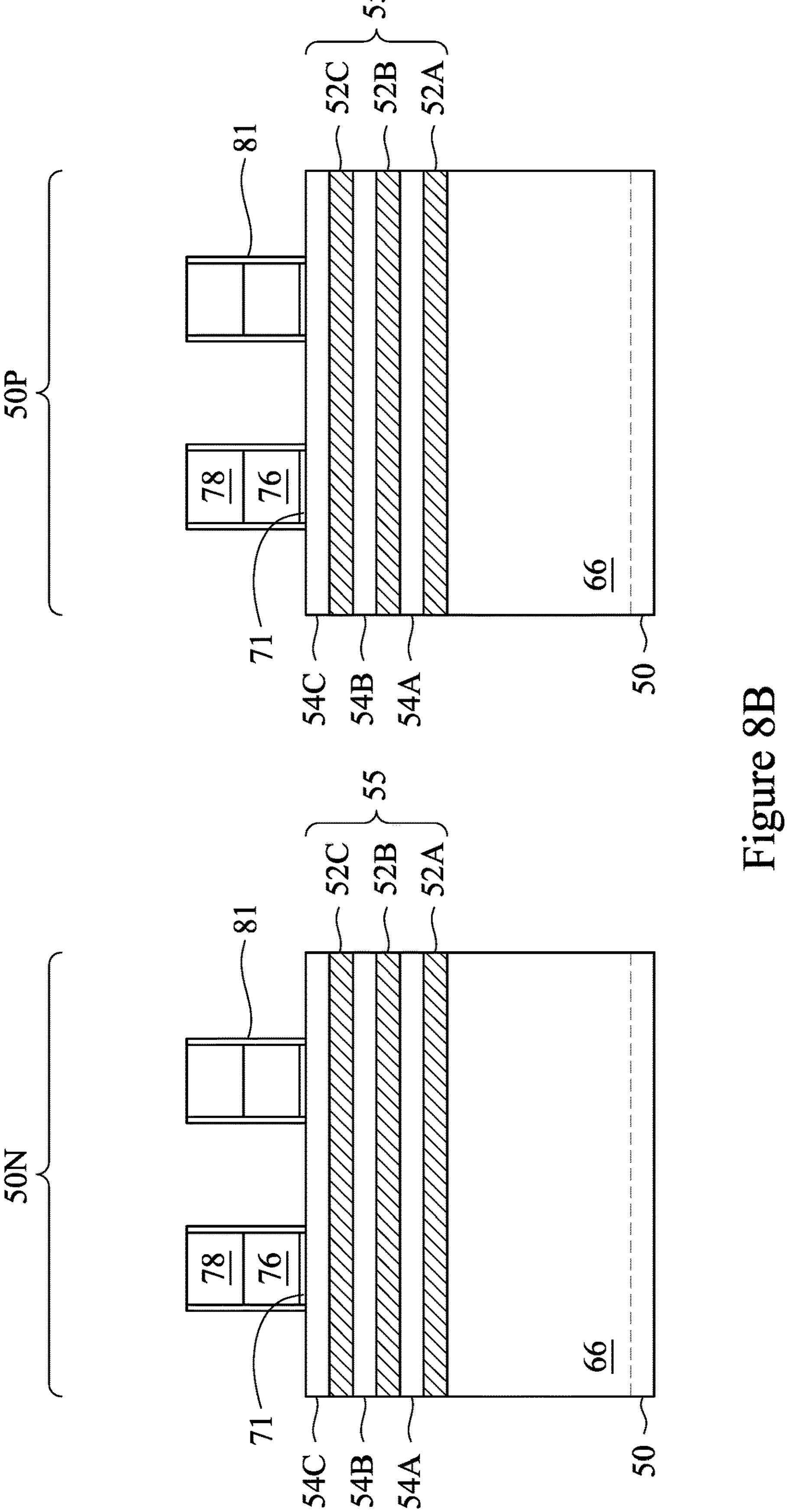

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
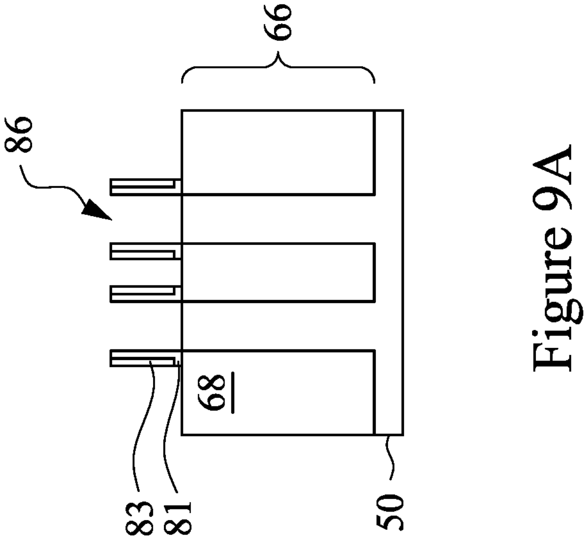
Figure 9B:
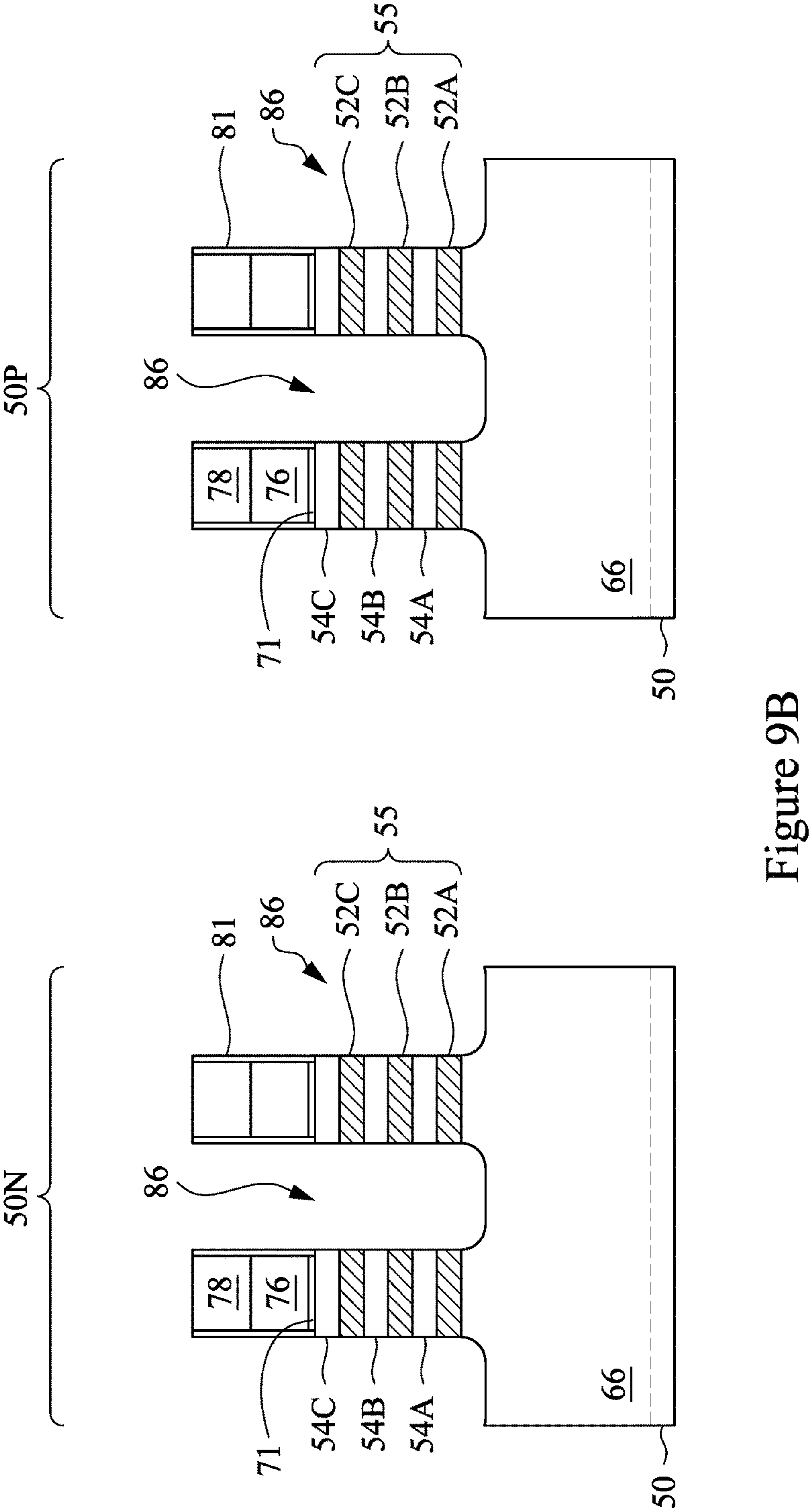

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
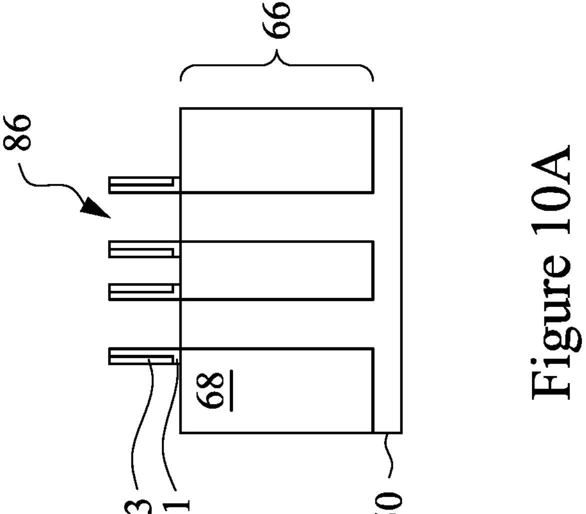
Figure 10B:
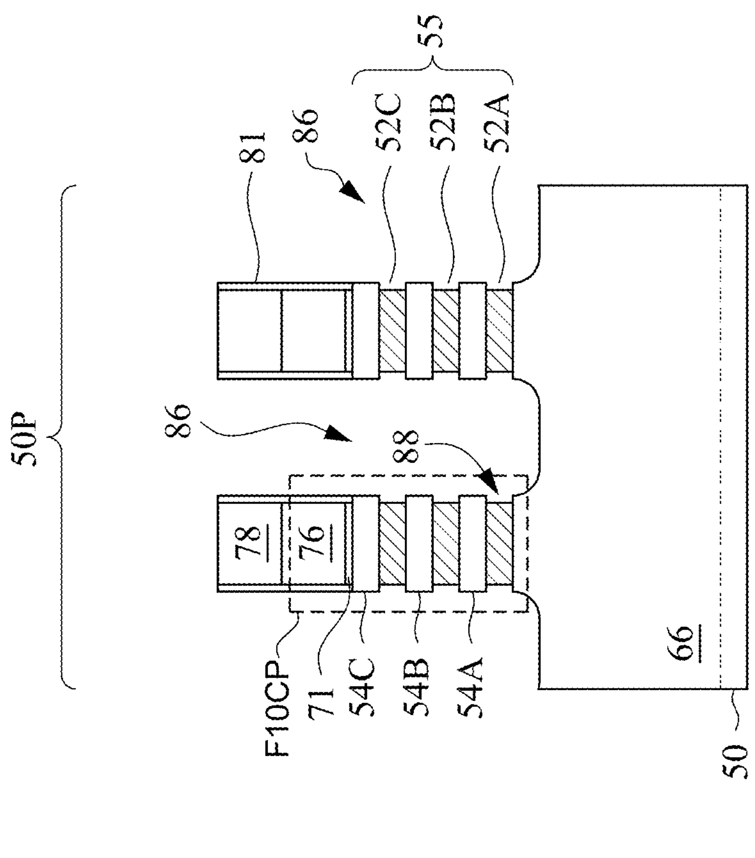
Figure 10B:
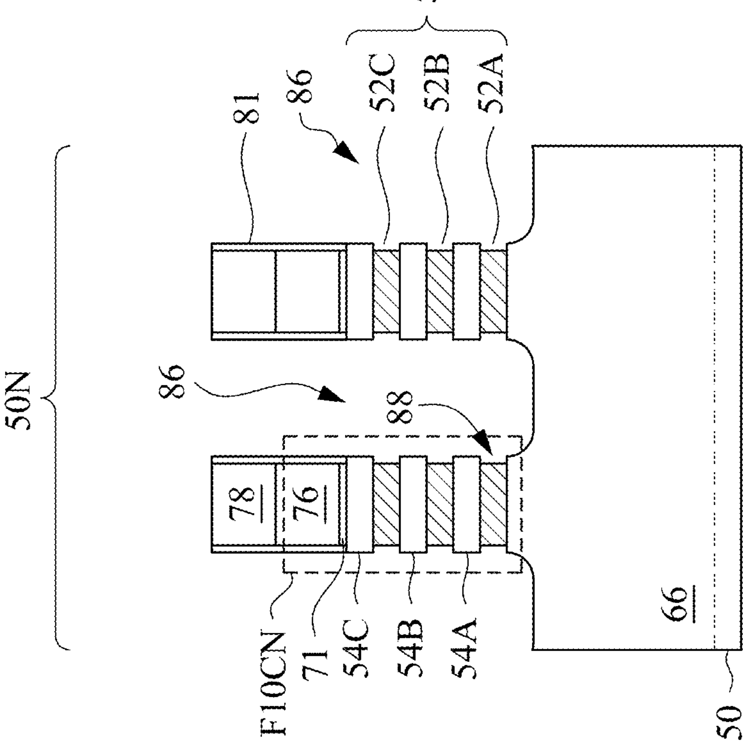
Figure 10C:
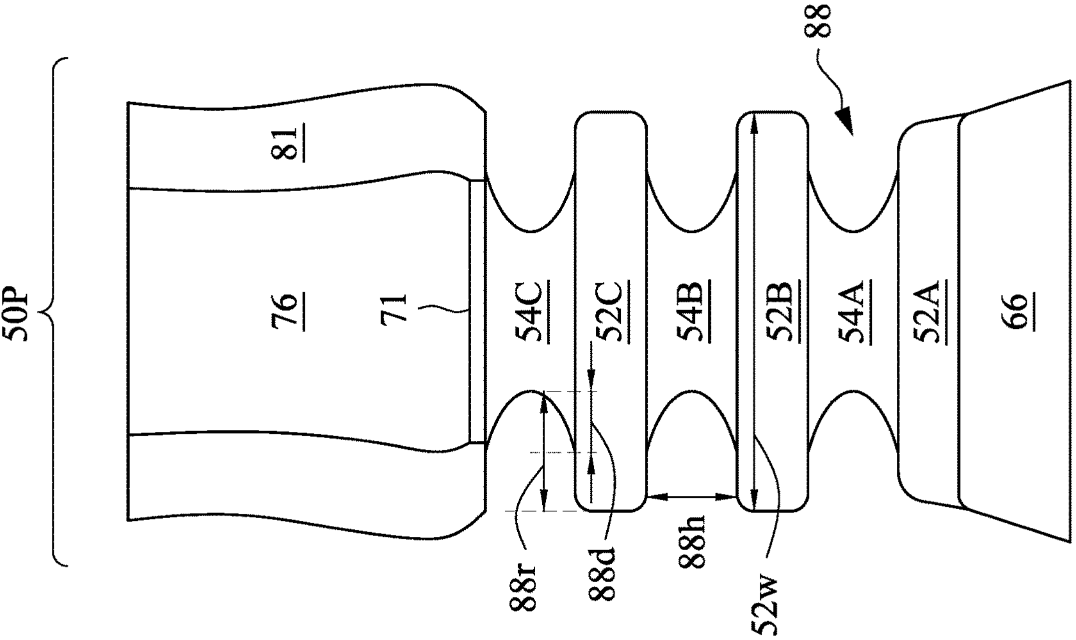
Figure 10C:
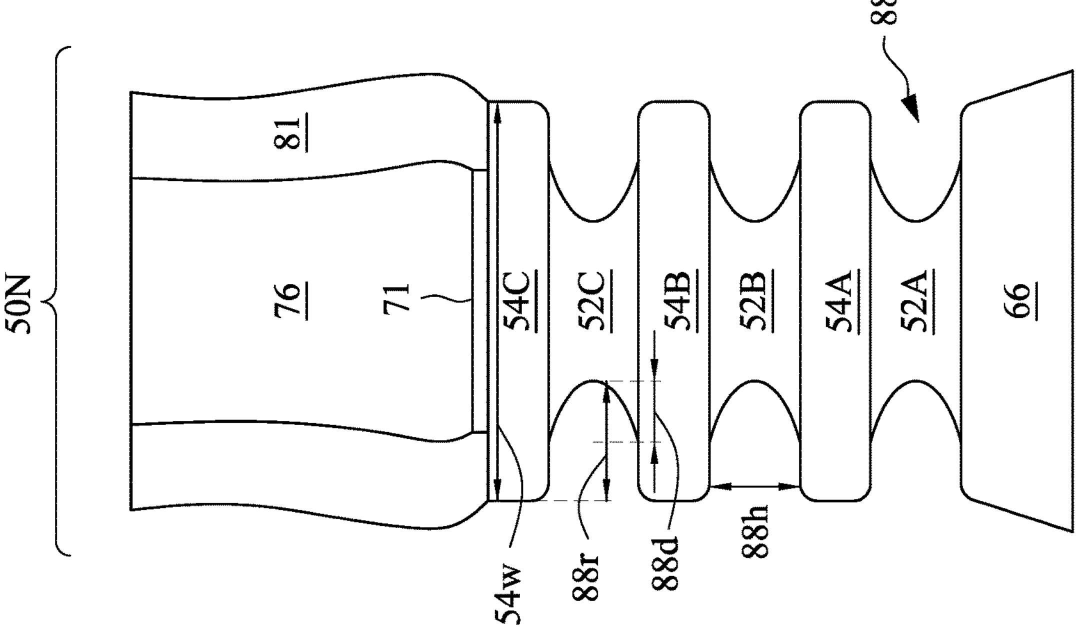

In FIGS. 10A, 10B, and 10C, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be convex or concave, such as illustrated in FIG. 10C. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

FIG. 10C illustrates an enlarged view of the region marked F10CN and F10CP in FIG. 10B, in accordance with some embodiments. Both the first nanostructures 52 and the second nanostructures 54 are etched in the process of forming the sidewall recesses 88, although in the n-type region 50N the first nanostructures 52 are etched more aggressively than the second nanostructures 54 in order to form the sidewall recesses 88. The p-type region 50P has a similar result, except that the second nanostructures 54 are etched more aggressively than the first nanostructures 52, forming the sidewall recesses 88 in the p-type region 50P. The width 54*w* of the second nanostructures 54 and the width 52*w* of the first nanostructures may be between about 10 nm and 40 nm. In the n-type region 50N, the lateral recess 88*r* is measured from the lateral extent of the width 54*w* of the second nanostructures 54. In the p-type region 50P, the lateral recess 88*r* is measured from the lateral extent of the width 52*w* of the first nanostructures 52. In some embodiments, the lateral recess depth 88*r* may be between 4 nm and about 12 nm or between 5% and 35% of the width 52*w*/54*w*. The etching also may cause a concavity or dishing of the sidewall recesses 88. The extent of dishing can be characterized by the dishing value 88*d*, which is the distance between the lateral extent of the first nanostructures 52 in the n-type region 50N (or the second nanostructures 54 in the p-type region 50P) and the deepest point of the sidewall recesses 88. In some embodiments, the dishing value 88*d* of the sidewall recesses 88 may be between 1 nm and about 6 nm, or between about 10% and 50% of the lateral recess 88*r*. It is noted that the dishing value 88*d* corresponds to an inverse dishing value of the subsequently formed spacers sharing the same interface. The maximum height 88*h* of the sidewall recesses 88 may be between 1 nm and 20 nm, such as between 2 nm and 12 nm, or between 0% and 20% larger than the thickness of one of the first nanostructures 52 in the n-type region 50N (or of the second nanostructures 54 in the p-type region 50P). Following the formation of the first recesses 86 and sidewall recesses 88, the aspect ratio of the first recesses 86 may be up to about 30:1, that is may have a depth up to about 30 times greater than its width, though greater aspect ratios may be possible and are also contemplated.

Figure 11A:
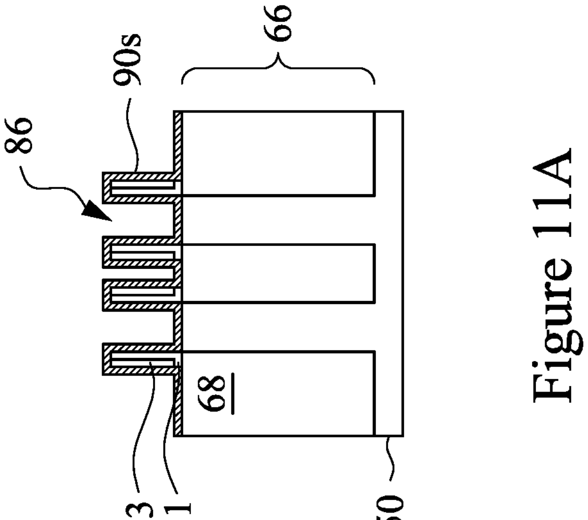
Figure 11B:
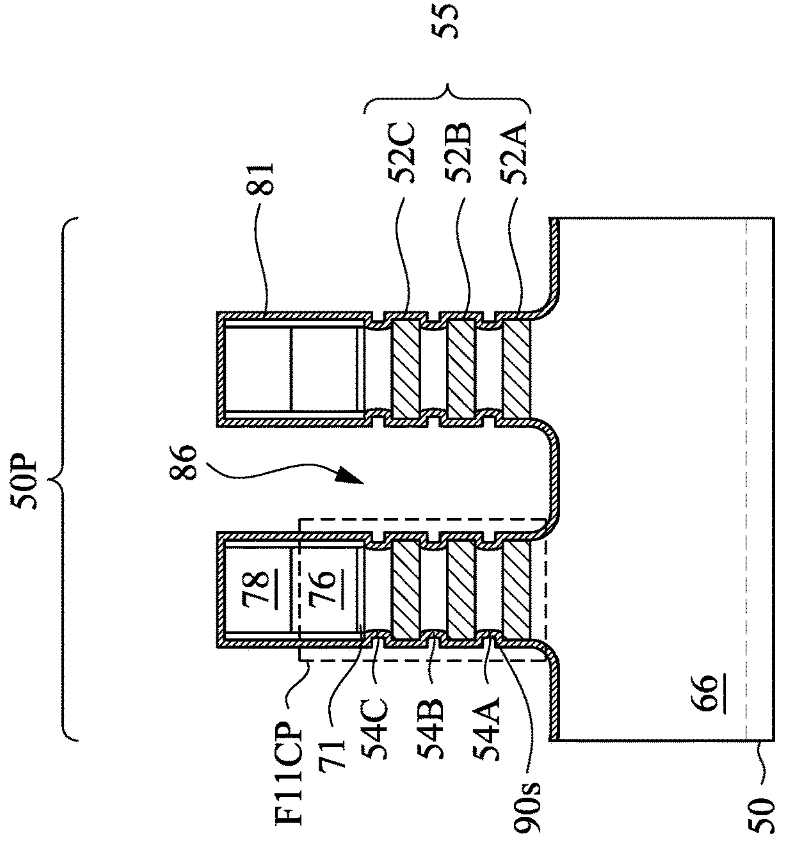
Figure 11B:
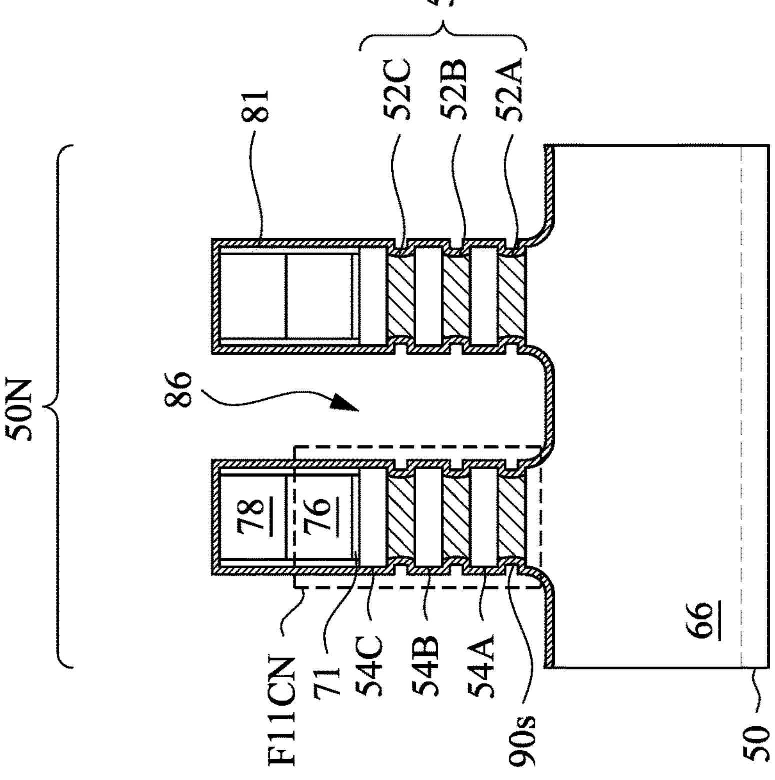
Figure 11C:
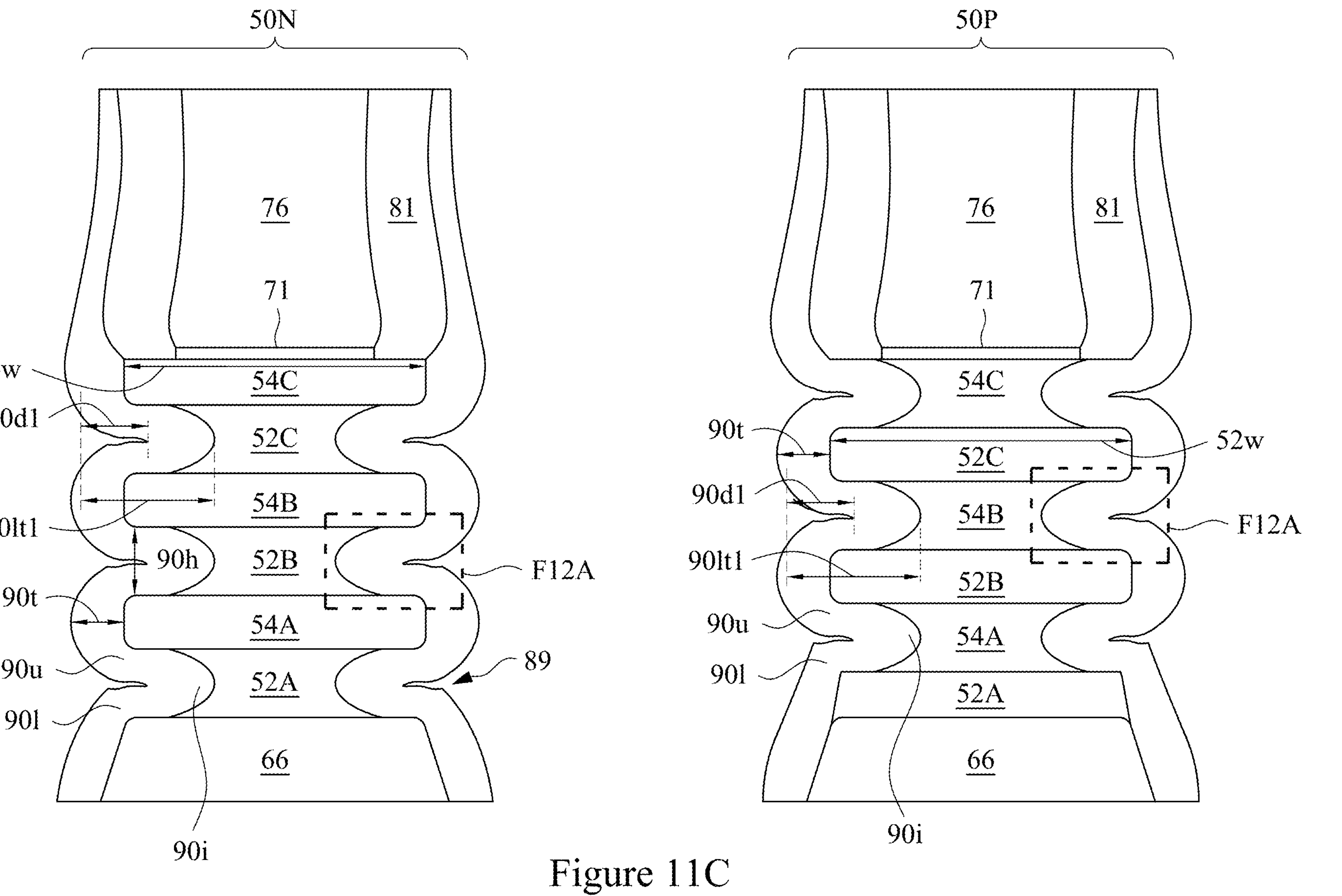

In FIGS. 11A, 11B, and 11C, a sidewall spacer layer 90*s* is formed in the sidewall recess 88. The sidewall spacer layer 90*s* may be formed by depositing the sidewall spacer layer 90*s* over the structures illustrated in FIGS. 10A, 10B, and 10C. In a subsequent step, the sidewall spacer layer 90*s* will be etched to form first inner spacers 90. The resulting first inner spacers 90 will act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The sidewall spacer layer 90*s* may be deposited by a conformal deposition process, such as CVD, ALD, or the like. The conformity of deposition may be between about 50% and 99%. The sidewall spacer layer 90*s* may comprise a material such as silicon nitride, silicon oxycarbonitride, or silicon oxynitride, although any suitable material may be utilized. In some embodiments, the sidewall spacer layer 90*s* is a low-k spacer layer which may deposited using precursors, such as $SiH_xCl_yR_z$ (R=CH$_3$, NCH$_3$), $SiH_xCl_y$, $SiH_x(R1)_yCl_x(R2)_z$ (R1=CH, R2=NCH$_3$), $C_xH_y$, $N_x/O_y/H_z$ and deposited at temperature between about 23° C. and about 700° C.

As deposited, the sidewall spacer layer 90*s* may include an elemental composition where C is 5-20%, N is 10-30%, 0 is 20-50%, and Si is 30-50%, by atomic ratio. The sidewall spacer layer 90*s* may be a low-k film with k-value from about 3.0 to 7.0. The density can be varied from about 2 to 7 g/cm$^3$ depending on the composition. For example, in some embodiments, such as when the material is silicon oxycarbonitride, the sidewall spacer layer 90*s* may have a k-value between about 4.9 and 5.4 as deposited and may have a density between 2.5 and 2.7 g/cm$^3$. In addition, the sidewall spacer layer 90*s* may include trace amounts of the precursor materials (other than the primary materials), such as Cl and/or H.

In FIG. 11C, an enlarged view of the region marked F11CN of FIG. 11B is illustrated and an enlarged view of the region marked F11CP of FIG. 11B is illustrated, in accordance with some embodiments. FIG. 11C illustrates a detailed view of the sidewall spacer layer 90*s* following the deposition process.

As illustrated in FIG. 11C, in some embodiments, the deposition process of the sidewall inner spacers 90 results in a lateral or horizontal seam 89 or bird's beak opening formed between an upper portion 90*u* of the sidewall spacer layer 90*s* and a lower portion 90*l* of the sidewall spacer layer 90*s* and having a seam termination corresponding to a side portion 90*i* of the sidewall spacer layer 90*s*. The upper portion 90*u* of the sidewall spacer layer 90*s* results from the conformal deposition of the material of the sidewall spacer layer 90*s* on the bottom surfaces of the exposed second nanostructures 54. The lower portion 90*l* of the sidewall spacer layer 90*s* results from the conformal deposition of the material of the sidewall spacer layer 90*s* on the upper surfaces of the exposed second nano structures 54. And the side portion 90*i* of the sidewall spacer layer 90*s* results from the conformal deposition of the material of the sidewall spacer layer 90*s* on first nanostructures 52 in the sidewall recesses 88. The height 90*h* of the sidewall spacer layer 90*s* between second nanostructures 54 in the n-type region 50N and between first nanostructures in the p-type region 50P corresponds to the height 88*h* (or thickness of the first nanostructures 52 in the n-type region 50N or thickness of the second nanostructures 54 in the p-type region 50P) of FIG. 10C. As illustrated in FIG. 11C, the horizontal seam 89 has a beaked opening. The lateral thickness 901*t*1 of the sidewall spacer layer 90*s* may be between 2 nm and 30 nm and the dishing 90*d*1 prior to processing may be between 25% and 75% of the lateral thickness 901*t*1, such as between about 1 nm and 23 nm.

The material composition of the sidewall spacer layer 90*s* as deposited is predominantly uniform and, as noted above, may be a composition of SiOCN. The uniform nature of the sidewall spacer layer 90*s* is incompatible with some downstream etching processes. For example, a subsequent etching process and cleaning process to remove a portion of the sidewall spacer layer 90*s* to form first inner spacers 90 could also remove more of the first inner spacers 90 than desired, leading to poor $C_{eff}$ performance resulting from leakage between the subsequently formed source/drain regions and the subsequently formed gate electrodes. Further, the extreme dishing and lateral seams 89 would decrease the effectiveness of the first inner spacers 90 leading to worse $C_{eff}$ performance of the transistor when formed. This performance decrease would result because, when the source/drain regions are formed, electrical leakage from the source/drain regions can flow through the lateral seams 89, reducing the effectiveness of the first inner spacers 90. In some cases, a short may also occur between the subsequently formed source/drain regions and subsequently formed metal gate due to the lateral seams 89. One solution to reduce the dishing and reduce or eliminate the lateral seams 89 is a wet steam or dry oxygen anneal to oxidize the sidewall spacer layer 90*s*. While this solution would provide relief from the dishing and reduce or eliminate the lateral seams 89, it is time consuming and generally maintains a predominantly uniform material composition. In other words, the entire thickness of the sidewall spacer layer 90*s* is oxidized and so only accommodates a single etch selectivity etching rate for an etching chemistry.

A radical oxidation treatment is used in accordance with embodiments to provide oxidation of the sidewall spacer layer 90*s* which causes the lateral seams 89 to merge through an intense oxidation process. The radical oxidation treatment process also provides oxidation which a much more concentrated oxidation profile at the surfaces of the sidewall spacer layer 90s with a parabolic concentration gradient which accommodates different etch selectivities for different parts of the sidewall spacer layer 90s. This allows the sidewall spacer layer 90s to be etched or trimmed to form first inner spacers 90 much more reliably due to the changing etch selectivity in the sidewall spacer layer 90s.

In some embodiments, the radical oxidation treatment may be performed on the structures illustrated in FIGS. 11A, 11B, and 11C to reduce the dishing and reduce the lateral seams 89. In other embodiments, the sidewall spacer layer 90s may first be at least partially trimmed, for example using an anisotropic etching process to thin the outer surfaces of the sidewall spacer layer 90s, followed by the radical oxidation treatment.

FIGS. 12A-12D illustrate a radical oxidation treatment and crosslinking process to close the lateral seams 89, thereby closing the beaked openings and reducing the dishing associated with the sidewall spacer layer 90s. The treatment illustrated in FIGS. 12A-12D may be performed on the structure illustrated in FIGS. 11A, 11B, and 11C (i.e., prior to forming the first inner spacers 90) or may be performed on the structure illustrated in FIGS. 11A, 11B, and 11C after a trimming of the sidewall spacer layer 90s has been performed. FIG. 12A illustrates a close up of the box labeled F12A of FIG. 11C. FIG. 12A also includes a key which is used for FIGS. 12A-12D. In FIG. 12A, prior to the seam closing process, after forming the sidewall spacer layer 90s, various compounds including amine groups, hydroxyl groups, and methyl groups may be observed at the surfaces of the sidewall spacer layer 90s. These compounds may be artifacts of the deposition process for forming the sidewall spacer layer 90s. These compounds may include Si—OH, Si—$CH_3$, and Si—$NH_2$.

Figure 13B:
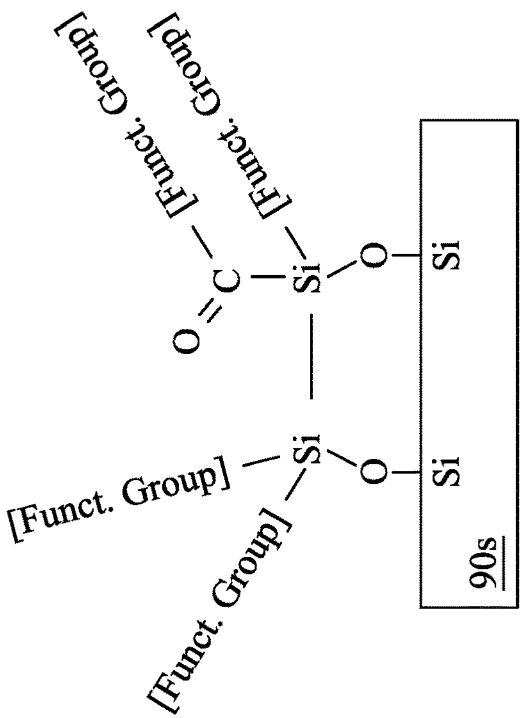
Figure 13A:
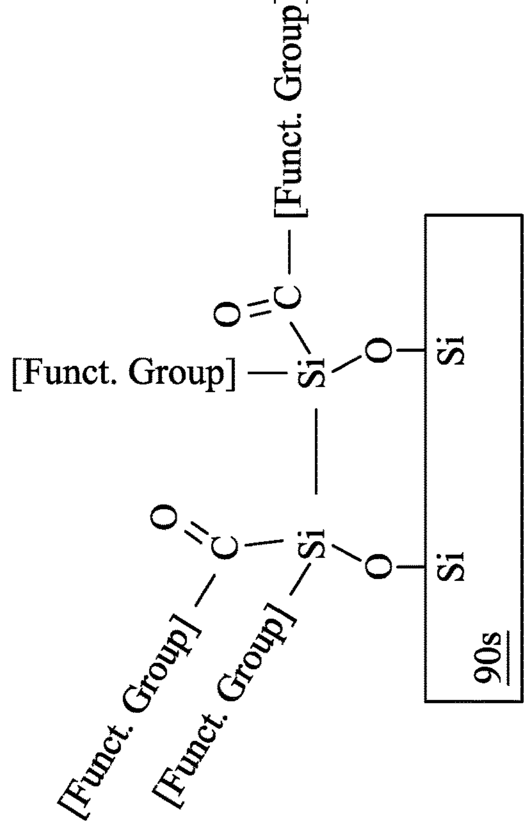

Referring briefly to FIGS. 13A and 13B, a close-up of the sidewall spacer layer 90s is illustrated. In FIG. 13A, one configuration for these compounds is illustrated and in FIG. 13B, another configuration for these compounds is illustrated. Some embodiments may include only the formation in FIG. 13A, some embodiments may include only the formation in FIG. 13B, and some embodiments may include the formation of both compounds. As seen in FIGS. 13A and 13B, silicon at the surface of the sidewall spacer layer 90s can be bonded by hydrogen bonds via oxygen atoms to complex compounds including Si, C, O, and Functional Groups, including $CH_3$, $NH_2$ or OH functional groups.

Returning to FIG. 12B, a radical oxidation treatment is begun to be performed. The radical oxidation treatment may be performed by utilizing a remote plasma system with a magnetic filter to provide OH* radicals and O* radicals as oxidants. The magnetic filter filters out ions, but allows the energized radicals to proceed into a processing chamber where the recesses 86 provide access to the sidewall spacer layer 90s. The energized radicals embed into the sidewall spacer layer 90s and alter the composition of the material of the sidewall spacer layer 90s. Ions can embed deeper than radicals, but because the ions are filtered out, the composition of the sidewall spacer layer 90s begins to have a concentration gradient which is parabolic, having a high concentration of oxygen nearer the surface of the sidewall spacer layer 90s from the radical oxidation treatment, followed by an exponentially degrading concentration, the deeper into the sidewall spacer layer 90s.

The radical oxidation treatment may be performed at a temperature between about 100° C. to about 500° C. for a duration between about 5 seconds and 30 minutes, and at a pressure between about 0.1 torr to about 25 torr. The radical oxidation treatment is performed by setting applying process gasses to the processing chamber, including inert gasses, which help purge unwanted materials from the processing chamber, setting the desired vacuum pressure and temperature, providing oxygen gas to a plasma generating chamber, igniting an oxygen plasma using acceptable processes, providing the oxygen plasma through the magnetic filter to the sidewall spacer layer 90s, stopping the plasma after treatment is complete, and purging and cooling the processing chamber. In some embodiments, the process gasses may include helium or argon which can also be effective to enhance radical density by increasing collision frequency. In some embodiments, OH* radicals can be generated by O* radicals reacting with ambient $H_2$, to form radicalized OH*.

As compared to a wet steam/anneal process, the radical oxidation treatment can be performed at a lower temperature and for a lesser duration to achieve seam closure. In addition, the oxidation profile is more desirable. The radical oxidation treatment removes residual amine groups by converting the amine groups into hydroxyl groups (Si—$NH_2$→Si—OH) and/or methyl groups into hydroxyl groups (Si—$CH_3$→Si—OH). The radical oxidation treatment also provides oxygen to the lateral seam 89, causing an expansion of the first inner spacers 90 and a reduction of the lateral seam 89.

In FIG. 12C, the radical oxidation treatment continues to cause an expansion of the sidewall spacer layer 90s and a reduction of the lateral seam 89, as the percentage of oxygen increases and the percentage of nitrogen decreases at the surface of the sidewall spacer layer 90s, causing the outer surfaces of the sidewall spacer layer 90s to become less dense and more voluminous. As the lateral seam 89 shrinks, the hydroxyl groups on the upper portion 90u of the first inner spacers 90 and the hydroxyl groups on the lower portion 90l of the first inner spacers 90 may combine to form Si—O—Si bonds (2Si—OH→Si—O—Si+$H_2O$). Following, the radical oxidation treatment, the processing chamber is degassed.

In FIG. 12D, a crosslinking process may be performed. The crosslinking process may be performed after purging the processing chamber from the oxygen radical process or may be performed in the same environment after stopping the plasma generation. In some embodiments, the crosslinking process may be performed in an ambient of $H_2$, $NH_3$, $N_2$, Ar, other inert gas(es), the like, and combinations thereof. The crosslinking process can continue to cause the sidewall spacer layer 90s and the lateral seam 89 to expand, causing the lateral seam 89 to be pinched closed. Water may be a byproduct of crosslinking the upper portion 90u of the sidewall spacer layer 90s with the lower portion 90l of the sidewall spacer layer 90s. Thus, at the same time the seam 89 is pinching closed, the hydroxyl groups at the upper portion 90u of the sidewall spacer layer 90s crosslink with hydroxyl groups at the lower portion 90l of the first inner spacers 90 to form Si—O—Si bonds and reduce polarization (2Si—OH□Si—O—Si+$H_2O$). The crosslinking process will also remove moisture byproduct ($H_2O$) from crosslinking. Because steam is not used, but rather the radical oxidation treatment, the amount of moisture needing removed is much less than when using a wet oxidation process and so the crosslinking may be performed at a lesser temperature and/or a lesser time, thereby reducing the risk of unwanted results from high temperature processes.

The processes represented by FIGS. 12A-12D may be repeated as many times as desired to achieve seam closing and cross-linking of the upper portion 90u of the spacer 90 and the lower portion 90l of the spacer 90. It should be noted that even though the seam is closed through the process to form the closed seam 91, examination of the first inner spacers 90, can reveal that there once was a seam, such as by observing small gaps in the closed seam 91 or artifacts from the seam closing process, such as remnants of Si—$CH_3$, Si—OH, Si—$NH_2$, and so forth.

Following the oxygen radical treatment, a contact angle of the sidewall spacer layer is altered to add between 10° to about 20°, going from 20° to 35° as deposited to 30° to 45° after treatment. Contact angle indicates the wettability of the film for subsequently deposited films.

Figure 14B:
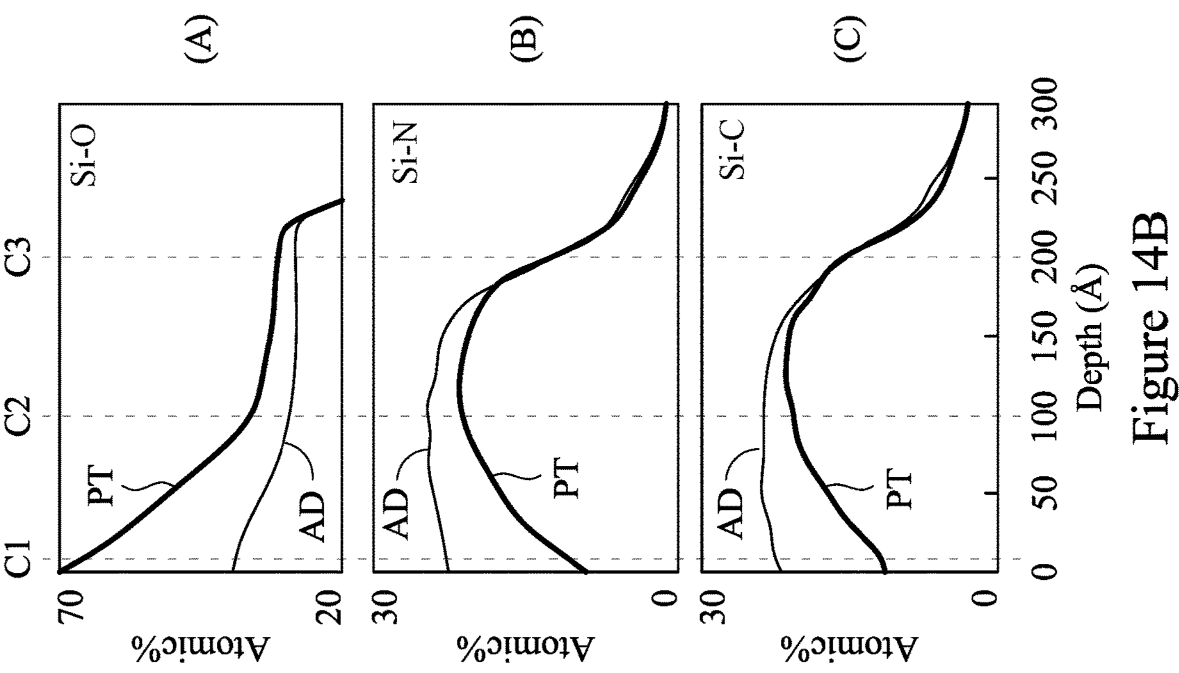
FIG. 14B illustrates graphs of concentration profiles of an spacer layer, in accordance with some embodiments.
Figure 14A:
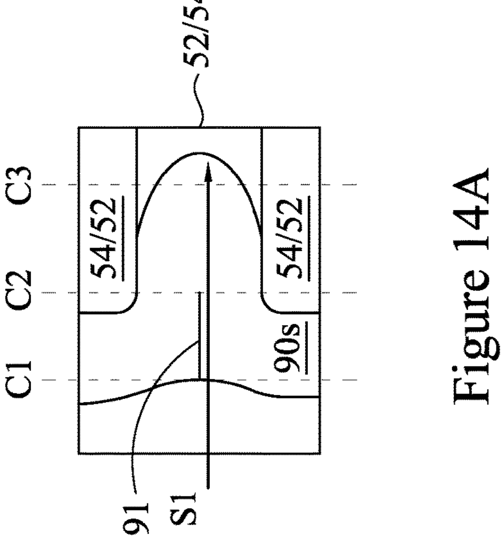

In FIGS. 14A and 14B illustrate example concentration gradient profiles for Si—O, Si—N, and Si—C for the as-deposited spacer sidewall layer 90*s* and the spacer sidewall layer 90*s* post-treatment. FIG. 14A provides a view similar to that of FIG. 12D which illustrates the sidewall spacer layer 90*s* post-treatment and the closed seam 91. The sidewall spacer layer 90*s* extends laterally into the sidewall recesses 88 (see FIGS. 10A, 10B, and 10C), which may correspond to the recessing of the first nanostructures 52 or the second nanostructures 54. Above and below the recessed first nanostructures 52 or second nanostructures 54 are the other of the second nanostructures 54 or the first nanostructures 52. For the sake of simplicity, these will be referred to by the first listed reference label, however, it should be understood that the references to first nanostructures 52 may be swapped with references to the second nanostructures 54 and vice versa. Three concentration reference lines are illustrated on FIG. 14A, which lines provide reference points for the corresponding concentration reference lines illustrated on FIG. 14B. The concentration reference line C1 corresponds to the innermost depression of the outer surface of the sidewall spacer layer 90*s*, for example, at the point where the closed seam 91 is closed at the outer surface of the sidewall spacer layer 90*s*. The concentration reference line C2 corresponds to the point where the first nanostructure 52 (over the second nanostructure 54) transitions from the side surface to the bottom surface or where the first nanostructure 52 (under the second nanostructure 54) transitions from the side surface to the top surface. In this example, the concentration reference line C3 corresponds to a point about 2 nm from the full lateral depth of the sidewall spacer layer 90*s*. In other embodiments where the sidewall recesses 88 are shallower or deeper, the concentration reference line C3 may be understood as corresponding to a point about 10% to 20% from the full lateral depth of the sidewall spacer layer 90*s*. The reference line Si represents a scan line and direction for the graphs illustrated in FIG. 14B. As illustrated in FIG. 14A the reference line S1 is slightly below (or may also be slightly above) the closed seam 91.

In FIG. 14B, three graphs are provided, in accordance with some embodiments. It should be understood that the lines provided are representative, but not intended to be fully limiting. Extrapolating values from the graphs should allow for some process variation such as +/−15-20%. The graphs are primarily provided to illustrate the shapes and nature of the concentration profiles for the material composition corresponding to Si—O (graph (A)), Si—N(graph (B)), and Si—C(graph (C)) pretreatment and post treatment. FIG. 14B includes corresponding concentration reference lines C1, C2, and C3 from FIG. 14A. These lines are aligned for each of the graphs (A), (B), and (C). The x-axis represents the depth in angstroms along the scan line S1, is labeled at the bottom of the graph (C), and applies to each of the graphs (A), (B), and (C). The y-axis is aligned for each of the graphs (A), (B), and (C) and includes the atomic percentage for each respective graph. A range is provided on the y-axis individually for each of the graphs (A), (B), and (C). Each of the graphs (A), (B), and (C) also includes a graphed line/curve for the respective composition as-deposited (AD) and post oxygen radical treatment (PT).

Turning to each of the graphs of FIG. 14B, graph (A) illustrates the concentration percentage of Si—O as-deposited (AD) and post treatment (PT). As-indicated in graph (A) the concentration at C1 is at about 70%, then decreases parabolically to the value at C3 of between about 30 and 35%. However, most of the gradient is realized between C1 and C2, where the concentration drops to between about 35% and 40%. Indeed, the vertex of the parabolic distribution is seen around the reference line C2. This result is beneficial because the etching selectivity of the sidewall spacer layer 90*s* is quite different between C1 and C2 than between C2 and C3. As such, the material between C1 and C2 may be trimmed or etched without overly adversely affecting the resulting first inner spacers 90 (see, e.g., FIG. 16).

Graph (B) of FIG. 14B further illustrates the difference in etching selectivity. Graph (B) illustrates the concentration percentage of Si—N as-deposited (AD) and post treatment (PT). Due to the oxygen radical treatment the percentage of N at C1 is reduced by about half, which then follows an upward concentration curve to the reference line C2, followed by a similar (but offset) curve as that originally deposited. This downward facing parabolic curve illustrates a vertex around C2. The reduced N percentage between C1 and C2 indicates that etchants selective to Si—O films will be effective between these ranges, but less effective between C2 and C3.

Graph (C) illustrates the concentration percentage of Si—C as-deposited (AD) and post treatment (PT). The curve in graph (C) is similar to that illustrated in graph (B). The higher levels of N and C between C2 and C3 provide better etching resistance for the first inner spacers 90 during trimming (e.g., etching) the sidewall spacer layer 90*s* to form the first inner spacers 90. Further, the higher concentration of C at the surface indicates remaining $CH_3$ terminals dispersed near the closed seam 91. This indicates that the closed seam 91 contains an airy, spatial, three-dimensional structure with reduced density, i.e., many air bubbles are distributed throughout the closed seam 91 area. These air bubbles further drive down the k-value of the resulting first inner spacers 90, thereby providing better isolation properties between the subsequently formed source/drain region at one side of the first inner spacers 90 and gate electrode layers at the other side of the first inner spacers 90.

It should be understood that the resulting gradient profiles are highly dependent on the oxygen radical treatment process selections and so these graphs should be taken as guidelines for the shapes of the resulting concentrations. For example, the respective PT curves may be offset laterally closer toward C3 for more aggressive oxygen radical treatment or closer toward C1 for less aggressive oxygen radical treatment.

Figure 15:
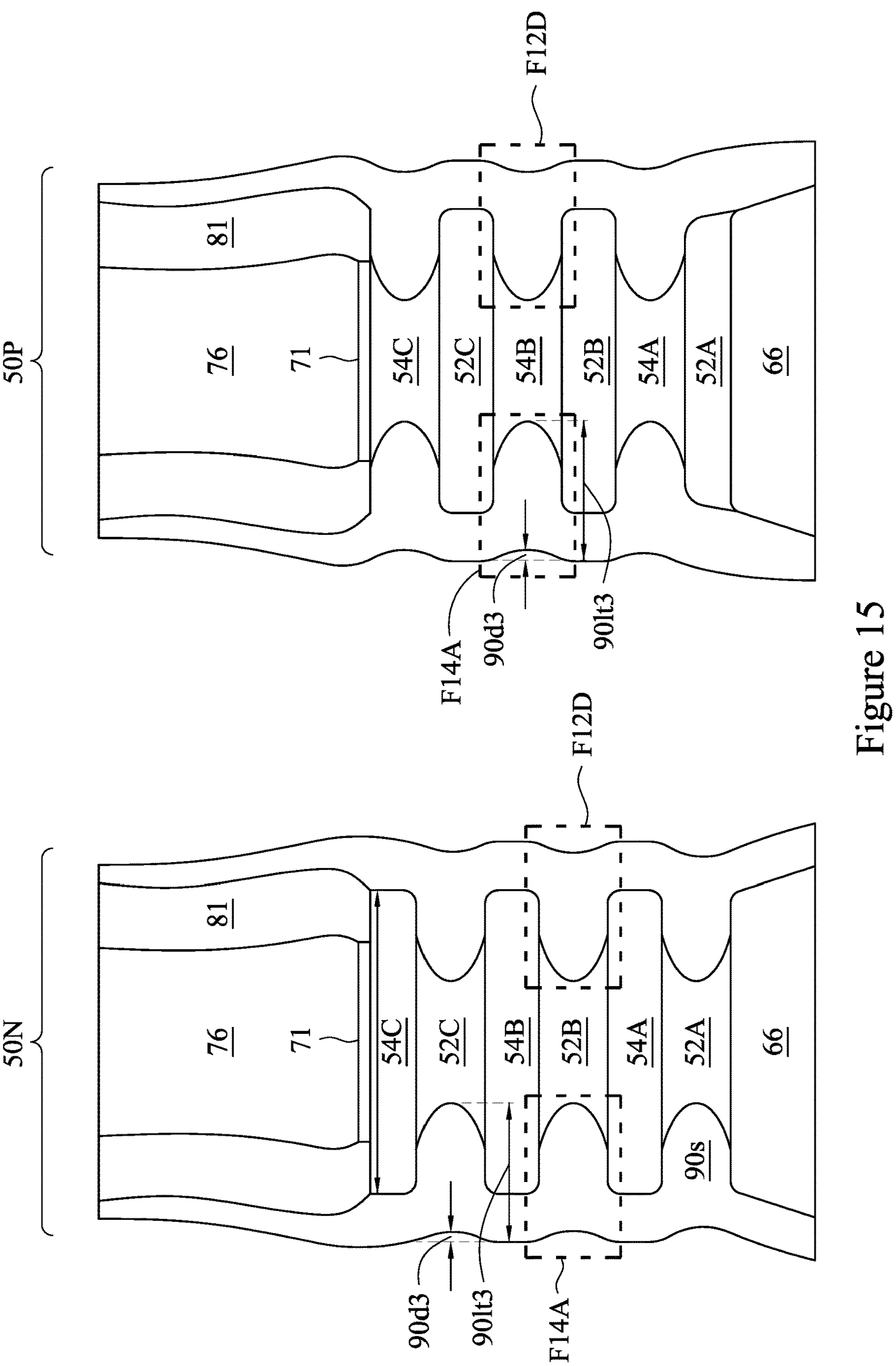

In FIG. 15, enlarged views of the regions marked F11CN and F11CP of FIG. 11B is illustrated, in accordance with some embodiments, after the oxygen radical treatment and crosslinking process of FIGS. 12A-12D has been performed. FIG. 12D is consistent with enlarged portion of the region marked F12D in FIG. 15. FIG. 14A is consistent with an enlarged portion of the regions marked F14A in FIG. 15. FIG. 15 illustrates a detailed view of the inner spacer layer 90*s* in the n-type region 50N and in the p-type region 50P following oxygen radical treatment and crosslinking process to de-seam the sidewall spacer layer 90*s* (which may also be referred to as the "de-seaming process").

FIG. 15 illustrates that the dishing 90*d*3 of the inner spacer layer 90*s* following the de-seaming process of FIGS. 12A-12D have been performed thereby reducing from the dishing 90*d*1 of the sidewall spacer layer 90*s* prior to the de-seaming process to the dishing 90*d*3. In some embodiments, the dishing 90*d*3 may be between 10% and 50% of the dishing 90*d*1, such as between 0 nm and 5 nm. In some embodiments, the dishing 90*d*1 of the sidewall spacer layer 90*s* is completely removed (or will be completely removed when the first inner spacers 90 are formed).

The de-seaming process of FIGS. 12A-12D may also reduce the k-value of the material of the inner spacer layer 90*s* to be less than the k-value of the nominal k-value of the deposited material. For example, the k-value of silicon carbonoxynitride as deposited may be between 4.9 and 5.4, whereas the k-value of the de-seamed inner spacer layer 90*s* after de-seaming may be between 4.5 and 5.1, representing a reduction between about 5% and 10%. The reduction in k-value occurs due to the oxidation of the inner spacer layer 90*s* during the heavy oxidation anneal, resulting in particular from the reduction of the percentage content of nitrogen (and increase in oxygen) in the inner spacer layer 90*s* and density reduction of the inner spacer layer 90*s*. Further, the size of the inner spacer layer 90*s* may increase by between about 5% and about 20% and the density of the inner spacer layer 90*s* may be decreased by about 5% to 15%. For example, the density of silicon carbonoxynitride as deposited may be between 2.5 and 2.7 g/cm$^3$. Following the de-seaming process, the density of the silicon carbonoxynitride may be decreased to be between about 2.2 and 2.4 g/cm$^3$. The resulting lateral thickness, for example, the overall lateral thickness 901*t*1 of FIGS. 11A, 11B, and 11C of the inner spacer layer 90*s* may expand to a lateral thickness 901*t*3 between about 2 nm and 35 nm, such as between 5 nm and 25 nm.

Figure 16A:
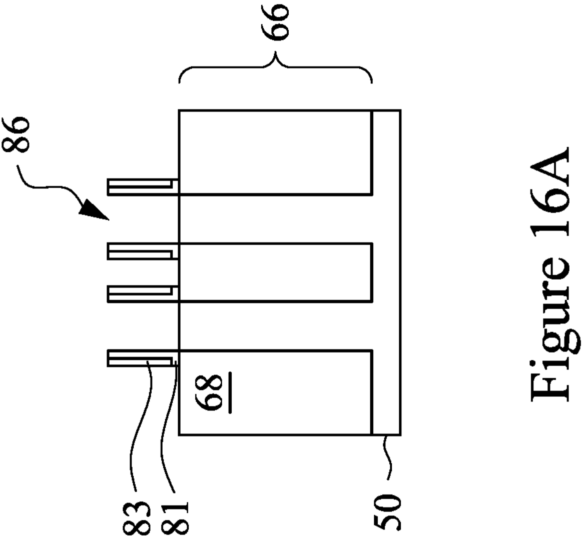
Figure 16B:
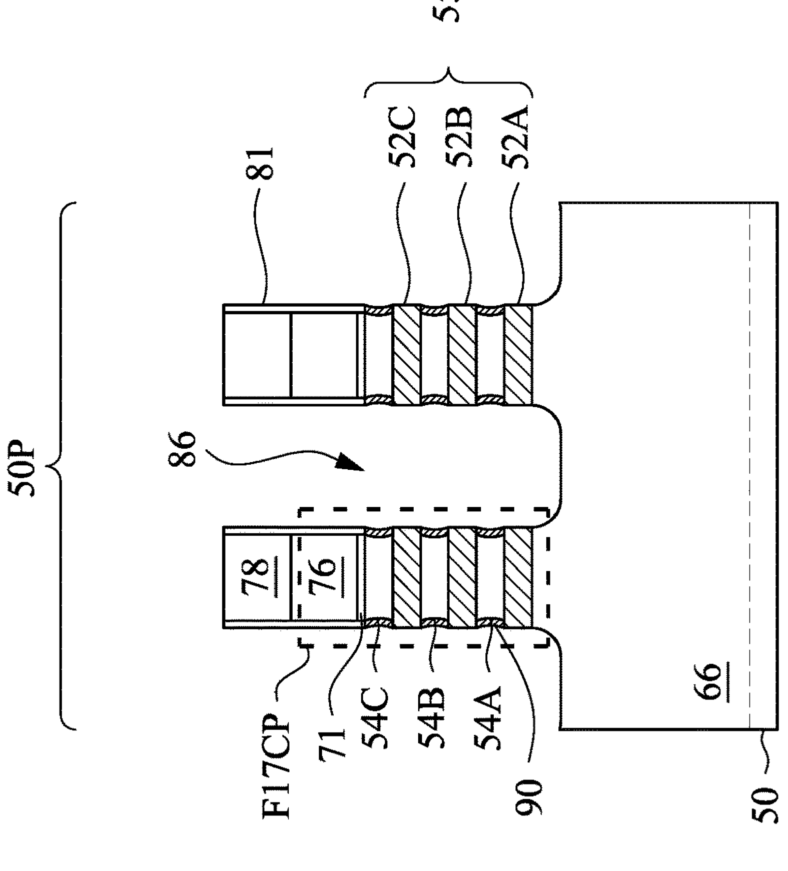
Figure 16B:
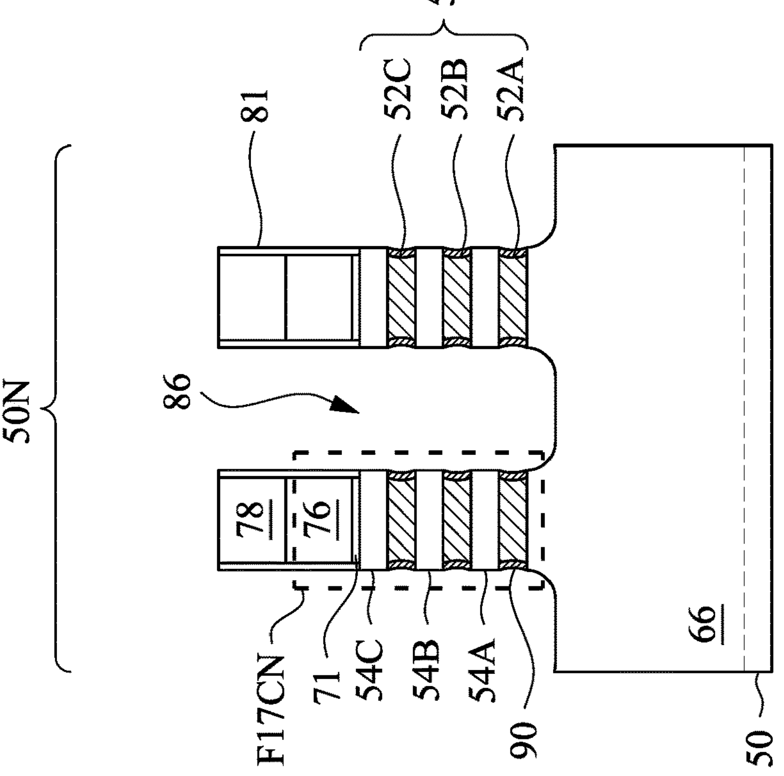

FIGS. 16A and 16B illustrate an anisotropic etching process to remove portions of the inner spacer layer 90*s* to form first inner spacers 90. In some embodiments, such as illustrated in FIG. 16B, the outer sidewalls of the first inner spacers 90 may be recessed from sidewalls of the second nanostructures 54 and/or the first nanostructures 52, respectively (depending on whether in the p-type region 50P or the n-type region 50N). The inner spacer layer 90*s* may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 18A-18C) by subsequent etching processes, such as etching processes used to form gate structures.

As discussed above, due to the oxygen radical treatment process, the sidewall spacer layer 90*s* may be etched to form the first inner spacers 90 using an etchant more selective to a first portion of the sidewall spacer layer 90*s* (e.g., between C1 and C2 of FIGS. 14A and 14B) and less selective to a second portion of the sidewall spacer layer 90*s* (e.g., between C2 and C3 of FIGS. 14A and 14B). Thus, the sidewall spacer layer 90*s* may be etched to form the first inner spacers 90 without damaging the first inner spacers 90.

Figure 17A:
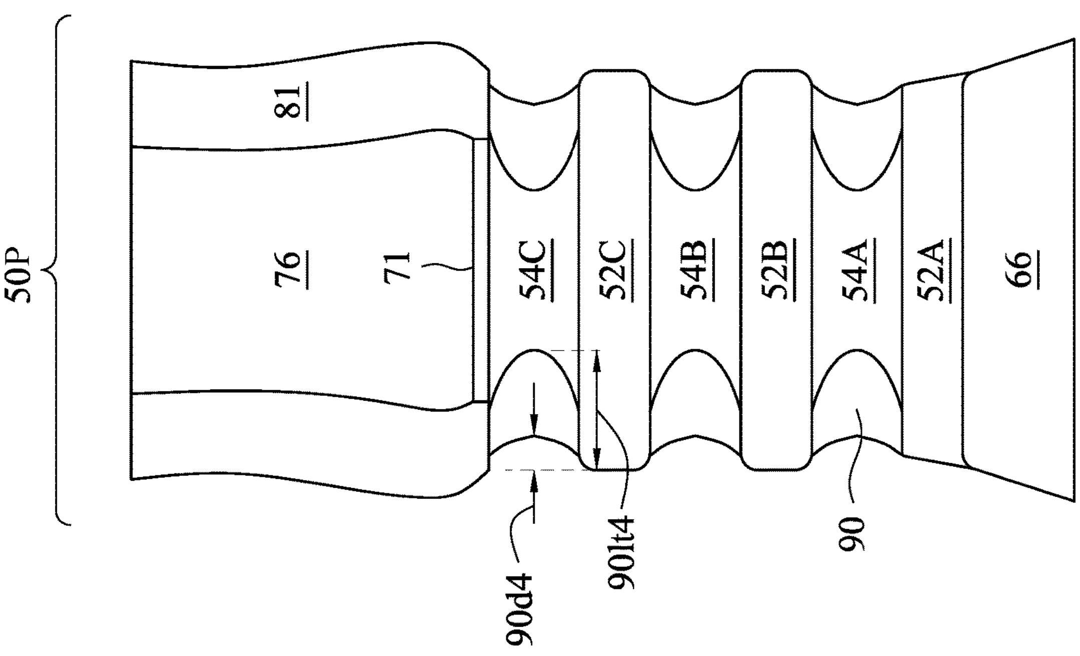
Figure 17A:
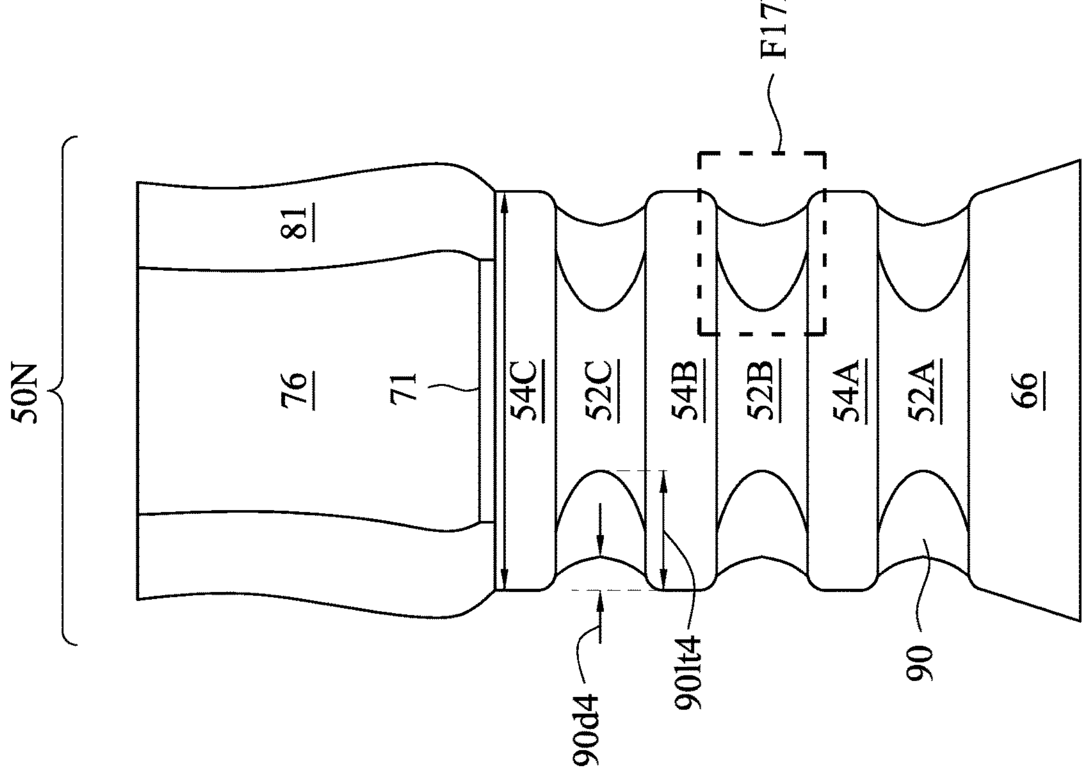
Figure 17B:
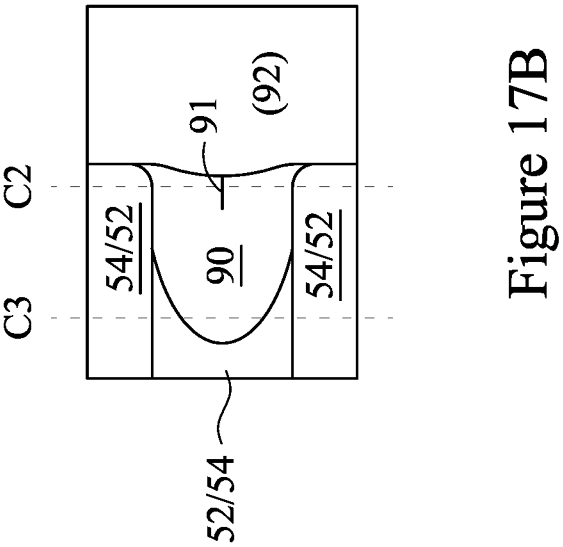

In FIG. 17A, enlarged views of the regions marked F17CN and F17CP of FIG. 16B are illustrated, in accordance with some embodiments, after trimming the sidewall spacer layer 90*s* to form the first inner spacers 90. FIG. 17B is consistent with enlarged portion of the region marked F17B in FIG. 17A. FIG. 17A illustrates a detailed view of the first inner spacers 90 in the n-type region 50N and in the p-type region 50P following the trimming process illustrated in FIGS. 16A and 16B.

FIGS. 17A and 17B illustrates that the dishing 90*d*4 of the first inner spacers 90 following the de-seaming process has been reduced from the dishing 90*d*1 of the sidewall spacer layer 90*s* prior to the de-seaming process. In some embodiments, the dishing 90*d*4 may be between 10% and 50% of the dishing 90*d*1, such as between 0 nm and 5 nm. In some embodiments, the dishing 90*d*4 of the first inner spacers 90 is completely removed. For example, in some embodiments, any remaining dishing from in the spacer layer 90*s* post treatment process may be removed when the spacer layer 90*s* is etched to form the first inner spacers 90. In such embodiments, the deepest part of the remaining dishing (see dishing 90*d*3 of FIG. 15) may be exposed to the anisotropic etch used to form the first inner spacers 90, thereby eliminating the dishing in the first inner spacers 90. Eliminating the dishing in the first inner spacers 90 advantageously provides better separation between subsequently formed source/drain regions and subsequently formed replacement gate structures.

The de-seaming process may also reduce the k-value of the material of the first inner spacers 90 to be less than the k-value of the nominal k-value of the deposited material, such as described above with respect to the inner spacer layer 90*s*. Further, the size of the first inner spacers 90 may increase by between about 5% and about 20% and the density of the inner spacer layer 90*s* may be decreased by about 5% to 15%. The resulting lateral thickness 901*t*4 of the first inner spacers 90 may be between about 2 nm and 15 nm, such as between 2 nm and 12 nm.

Following the oxygen radical treatment and crosslinking process, the first inner spacers 90 may include an elemental composition profile which can be characterized by the graphs in FIGS. 14A and 14B between the concentration references lines C2 and C3 (the area of C1 to C2 may mostly be removed). In particular, the concentration of C is 5-20%, N is 0-15%, 0 is 30-70%, and Si is 30-40%, by atomic percentage, after treatment.

FIG. 17B illustrates an enlarged view of the region marked F17B of FIG. 17A. FIG. 17B is labeled in a manner similar to that used with respect to FIG. 14A so that it can represent a first inner spacers 90 formed between first nanostructures 52 or second nanostructures 54. A source/drain region 92 is labelled (as discussed below with respect to FIGS. 18A-18C). As seen in FIG. 17B, the resulting first inner spacers 90 may have a fish shape in cross-sectional view, with fin tips extending to overlap a portion of the nano structure disposed over and/or under the first inner spacers 90. Also indicated in FIG. 17B is that the closed seam 91 may be observable even though it is closed. As noted above, it may have an especially airy less dense composition, small voids, and/or air bubbles disposed throughout. FIG. 17B also transfers the C2 reference line from FIG. 14A to illustrate that some of the first inner spacers 90 may be made of the area of the sidewall spacer layer between C1 and C2. In some embodiments, the parabolic gradient curve for oxygen flattens at a first lateral depth the depth corresponding to the reference line C2, which may be between about 20% and 50% of the total width of the first inner spacers 90. Because a portion of the area between C1 and C2 may be included in the first inner spacers 90, there may be 40% to 60% more oxygen at the exposed side of the first inner spacer 90 than at the opposite side of the first inner spacers 90. Similar features hold true for the nitrogen and carbon curves in that they can include a portion of the area between C1 and C2 in the first inner spacers 90, including their respective gradient curves.

Figure 18A:
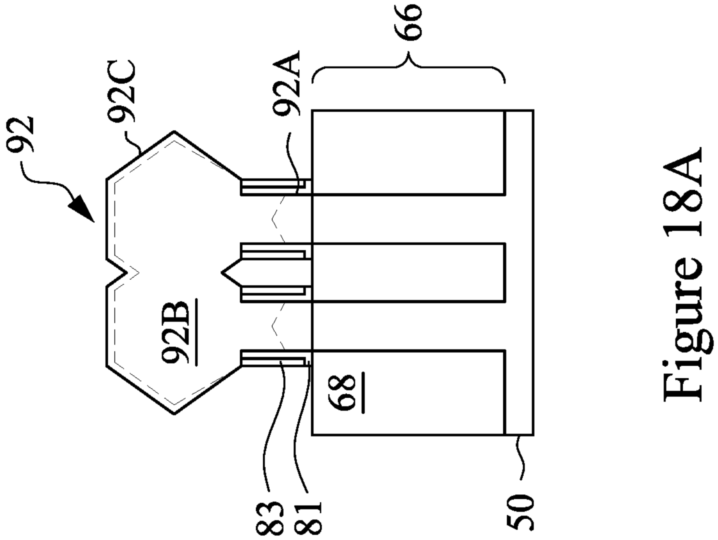
Figure 18B:
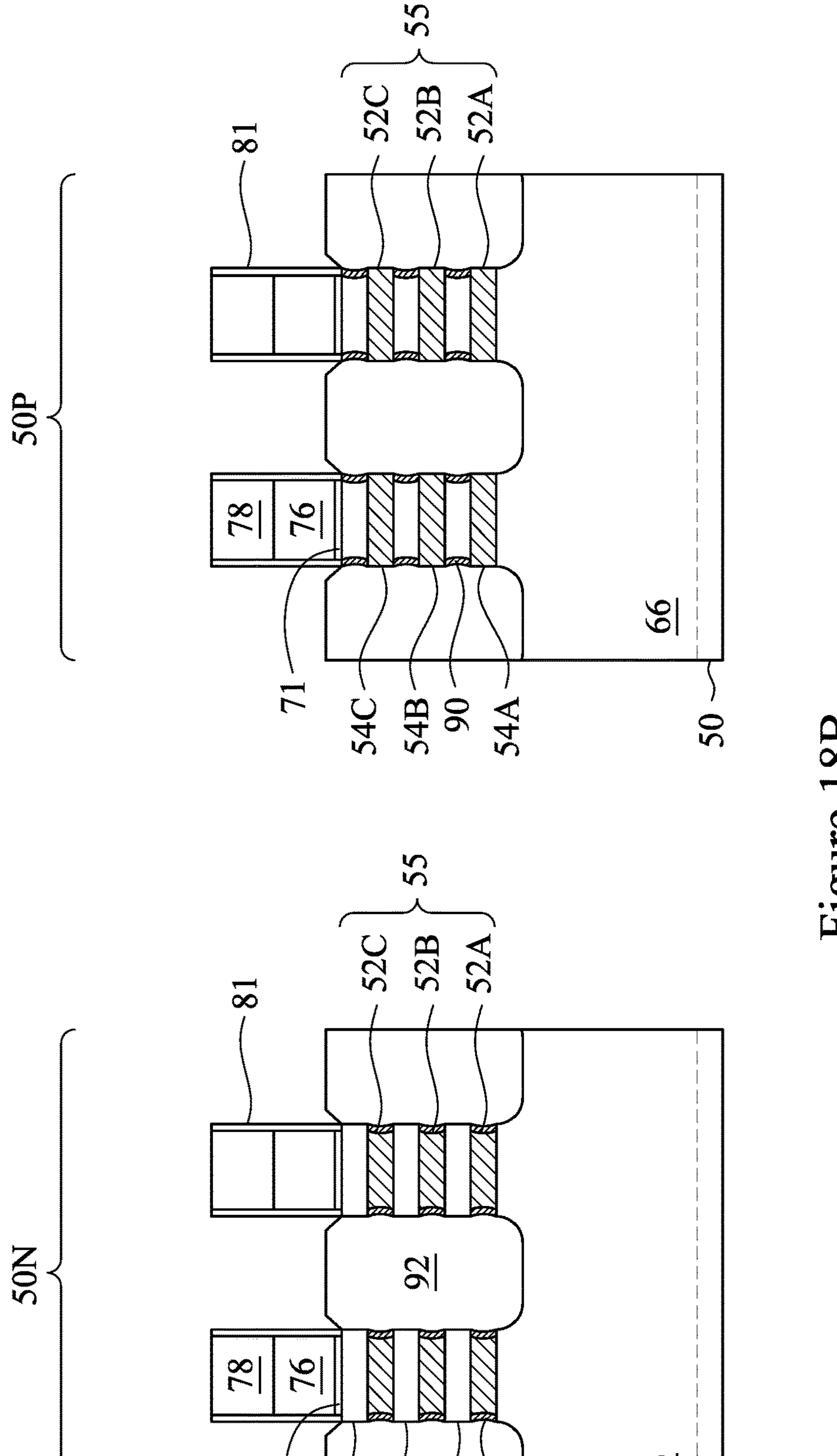
Figure 18C:
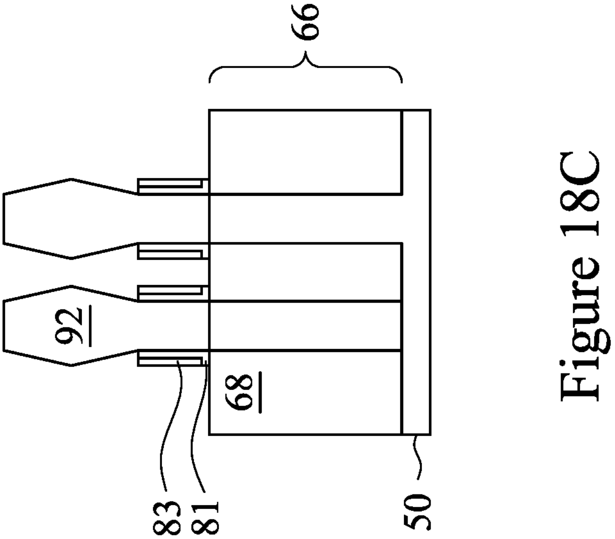

In FIGS. 18A-18C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/$cm^3$ and about $1\times10^{21}$ atoms/$cm^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 18A. In other embodiments, adjacent epitaxial source/drain regions 92 remain separated after the epitaxy process is completed as illustrated by FIG. 18C. In the embodiments illustrated in FIGS. 18A and 18C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 19A:
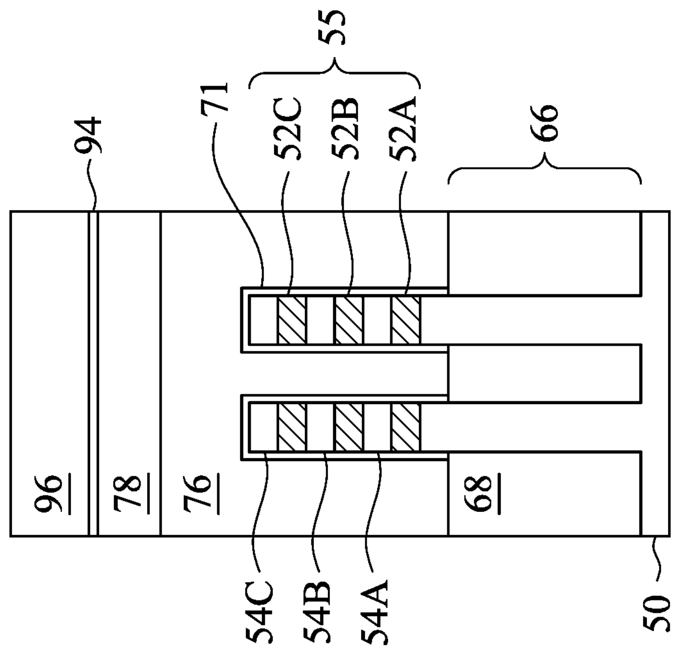
Figure 19B:
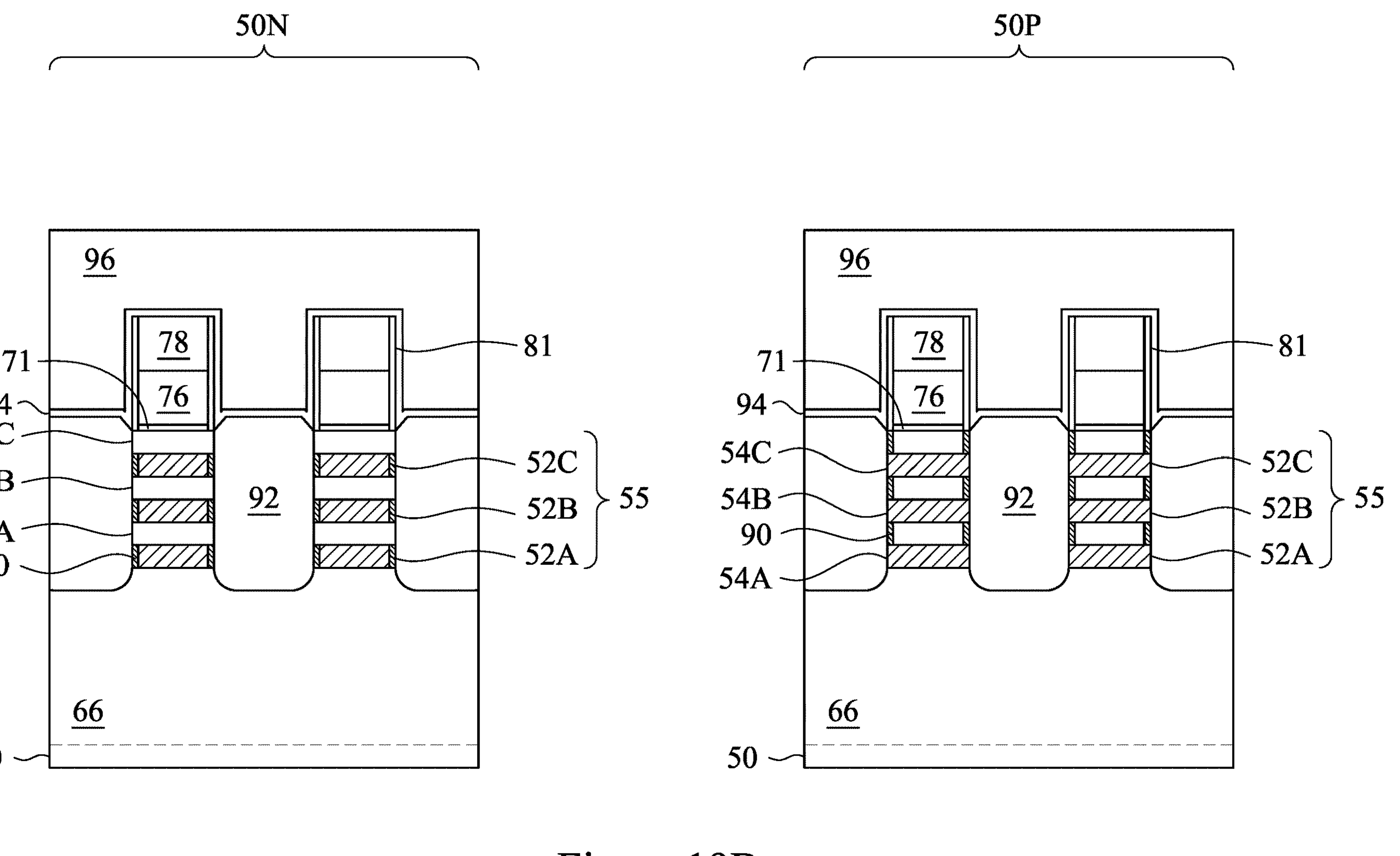
Figure 19C:
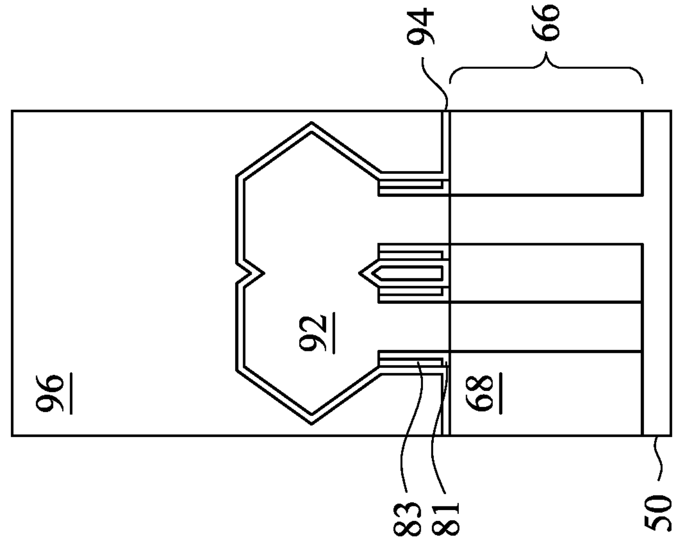

In FIGS. 19A-19C, a first interlayer dielectric (ILD) 96 is deposited over the structure illustrated in FIGS. 6A, 18B, and 18A (the processes of FIGS. 7A-18C do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 20A:
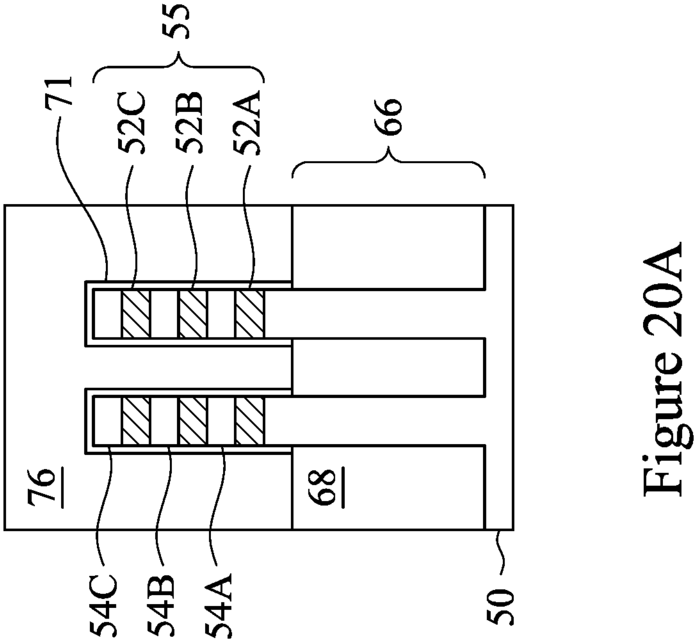
Figure 20B:
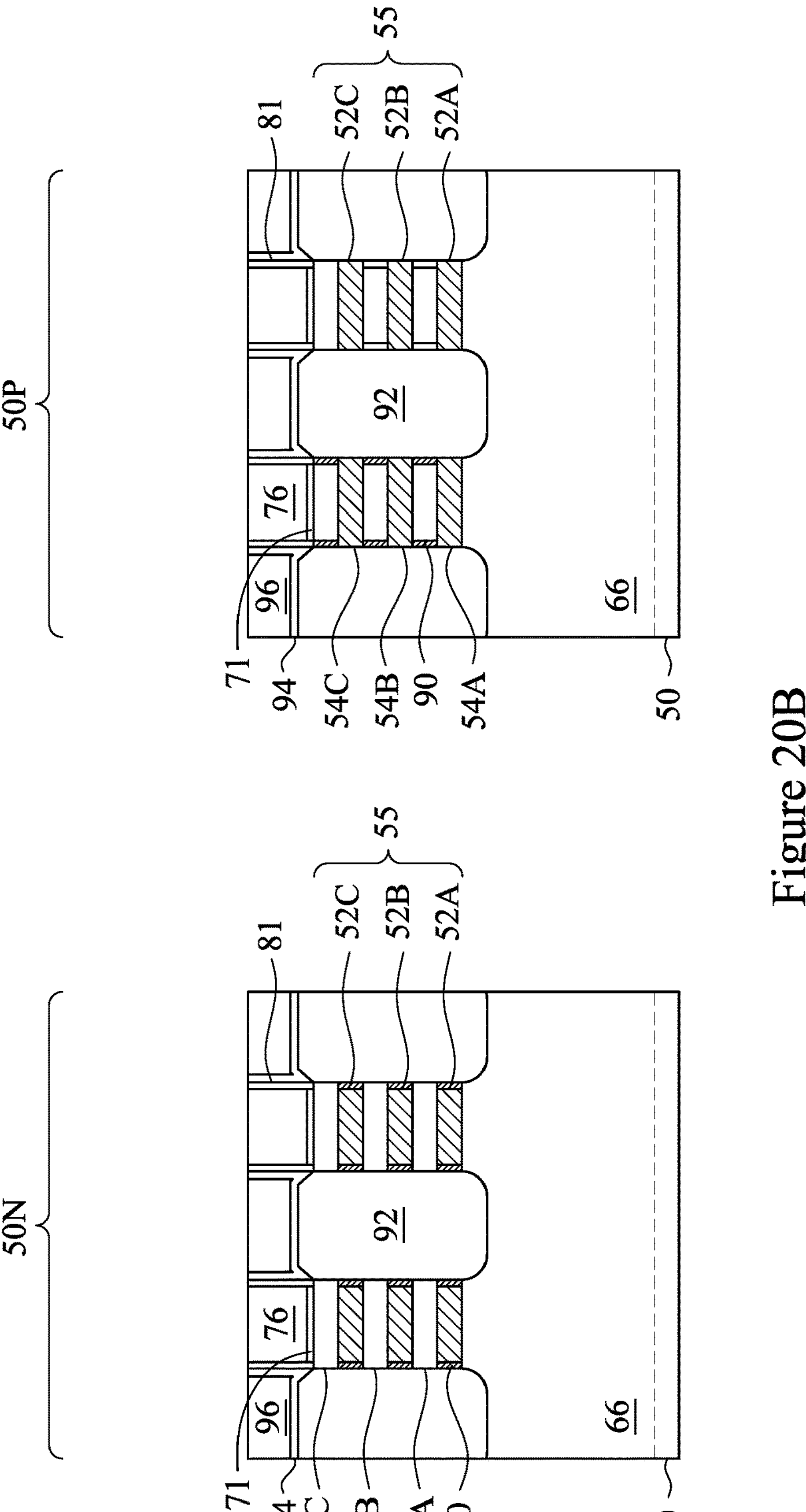

In FIGS. 20A and 20B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 21A:
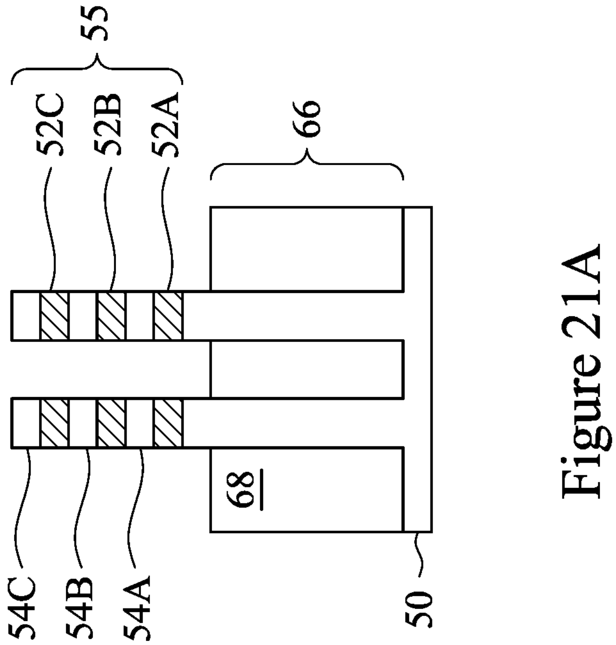
Figure 21B:
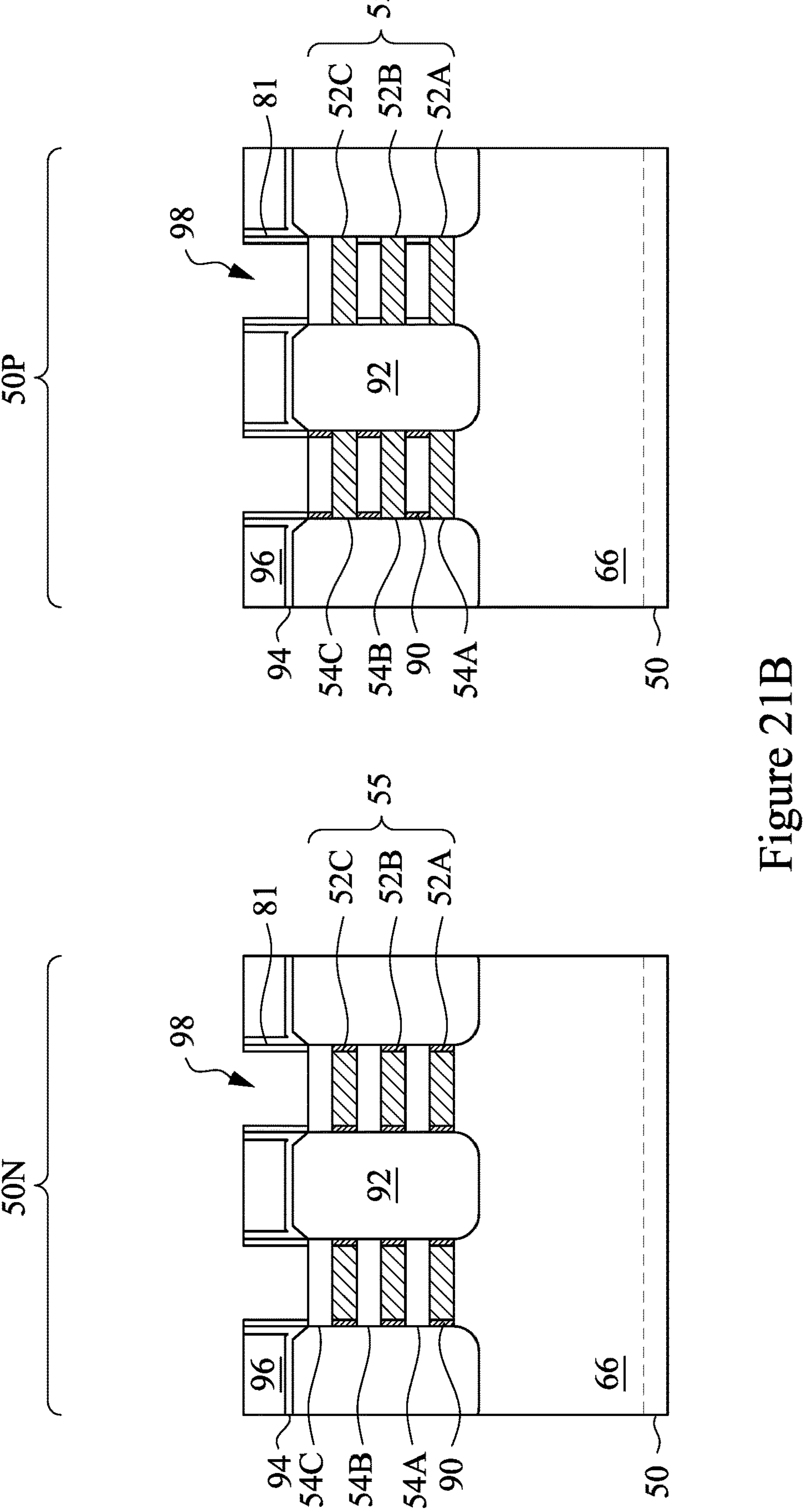

In FIGS. 21A and 21B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

In FIGS. 22A and 22B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETs may have a same material composition, such as silicon, silicon germanium, or the like. FIGS. 27A, 27B, and 27C illustrate a structure resulting from such embodiments where the channel regions in both the p-type region 50P and the n-type region 50N are provided by the second nanostructures 54 and comprise silicon, for example.

Following the removal of the first nanostructures 52 and/or second nanostructures 54, the first inner spacers 90 remain. Due to reducing and/or elimination the lateral seam, the first inner spacers 90 cause an increase in $C_{eff}$ and reduce the chance of shorting between the source/drain regions 92 and the subsequently formed metal gate.

Figure 23A:
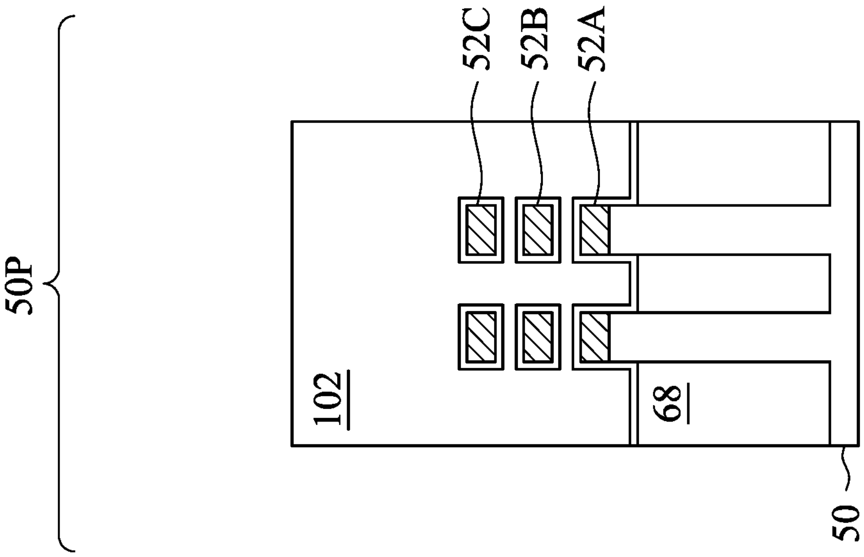
Figure 23A:
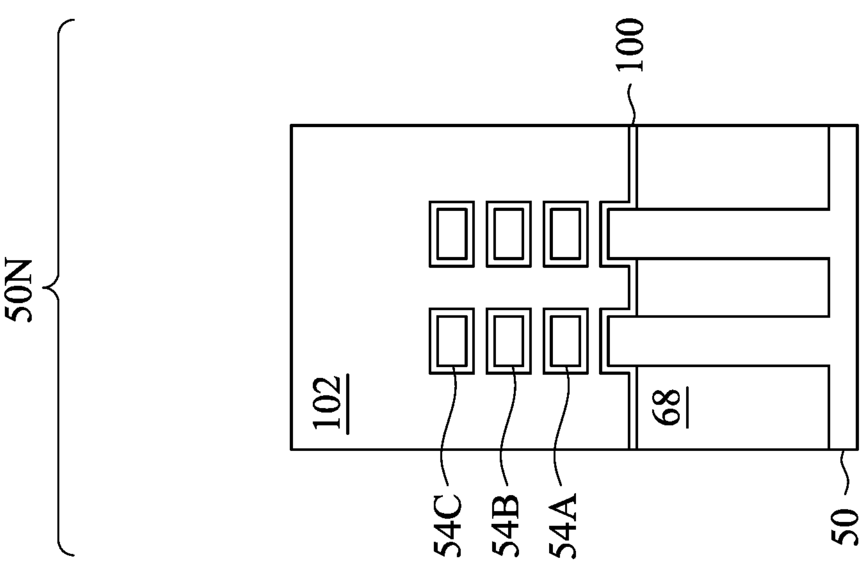
Figure 23B:
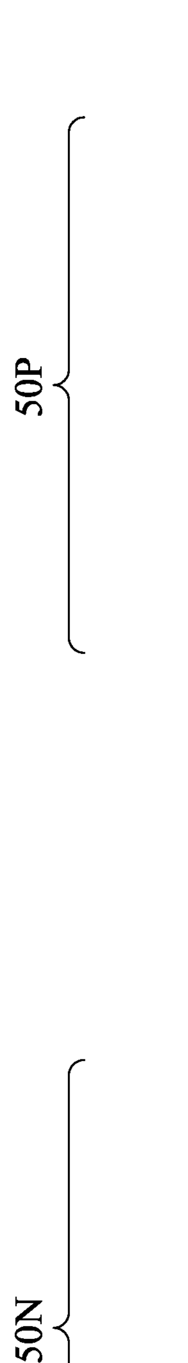
Figure 23B:
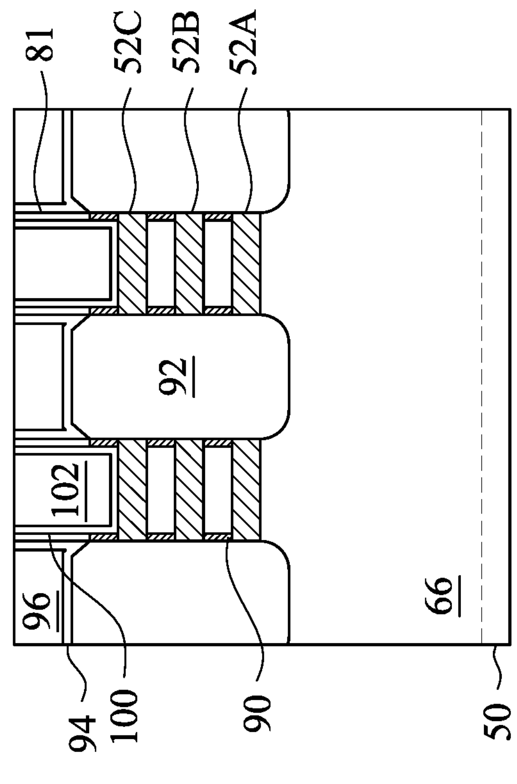
Figure 23B:
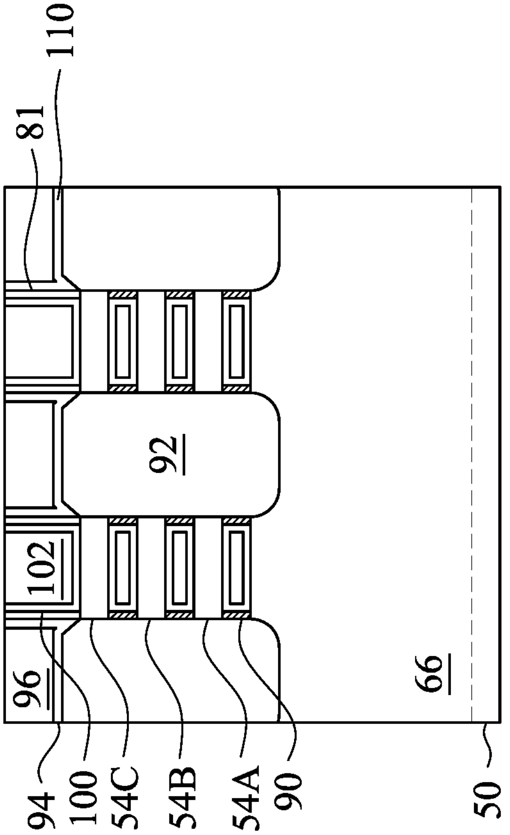

In FIGS. 23A and 23B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52, and along the first inner spacers 90. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 23A and 23B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 24A:
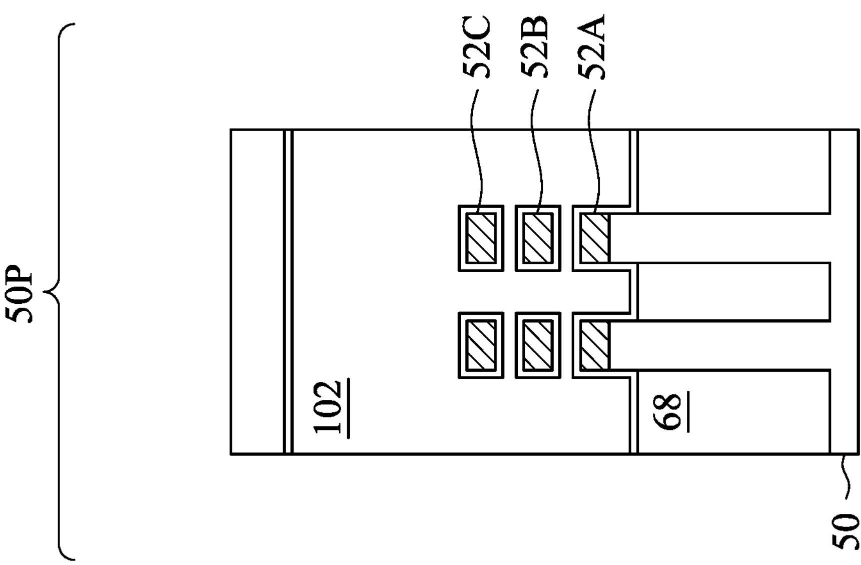
Figure 24A:
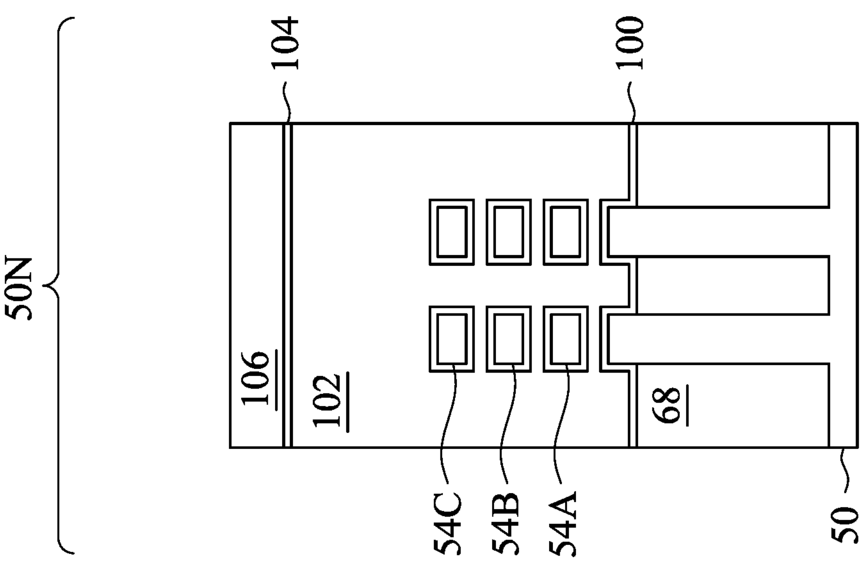
Figure 24B:
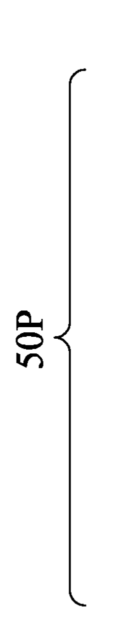
Figure 24B:
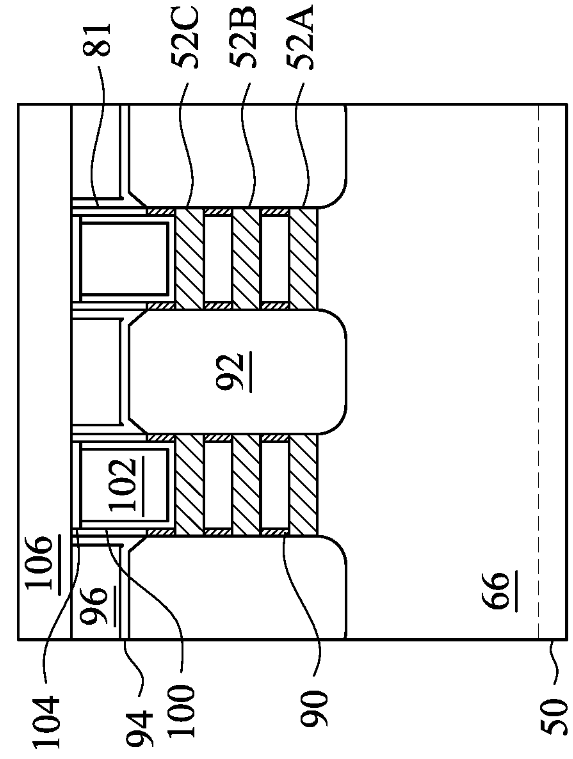
Figure 24B:
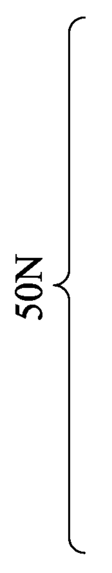
Figure 24B:
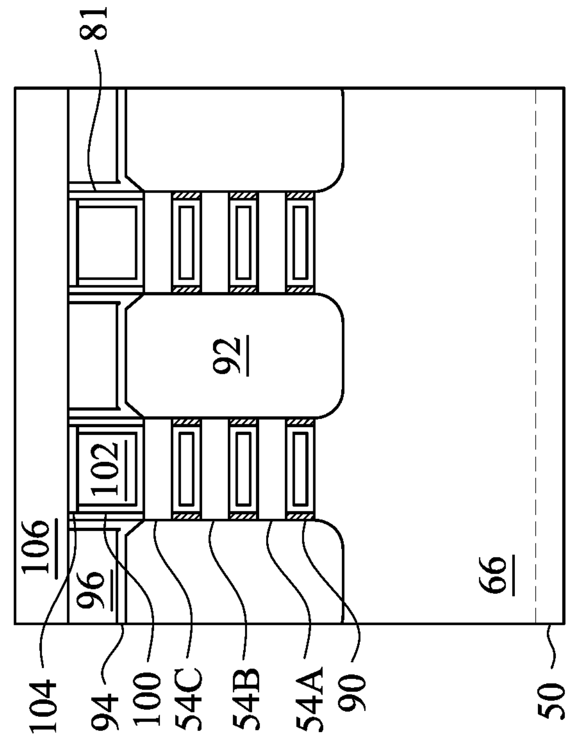
Figure 24C:
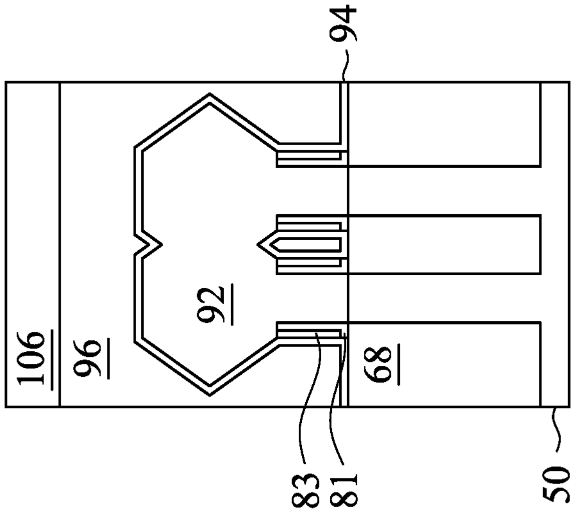

In FIGS. 24A-24C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 26A and 26B) penetrate through the gate mask 104 to contact the top surface of the recessed gate electrodes 102.

As further illustrated by FIGS. 24A-24C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 25A:
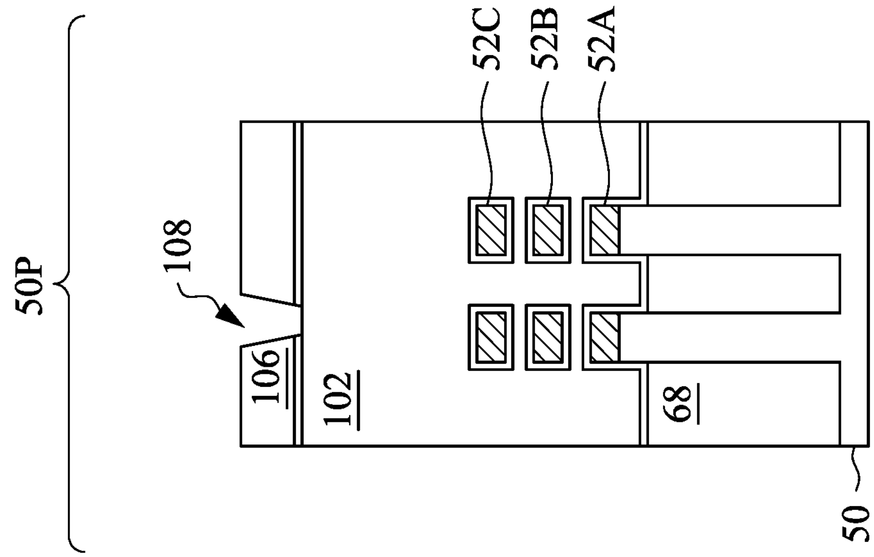
Figure 25A:
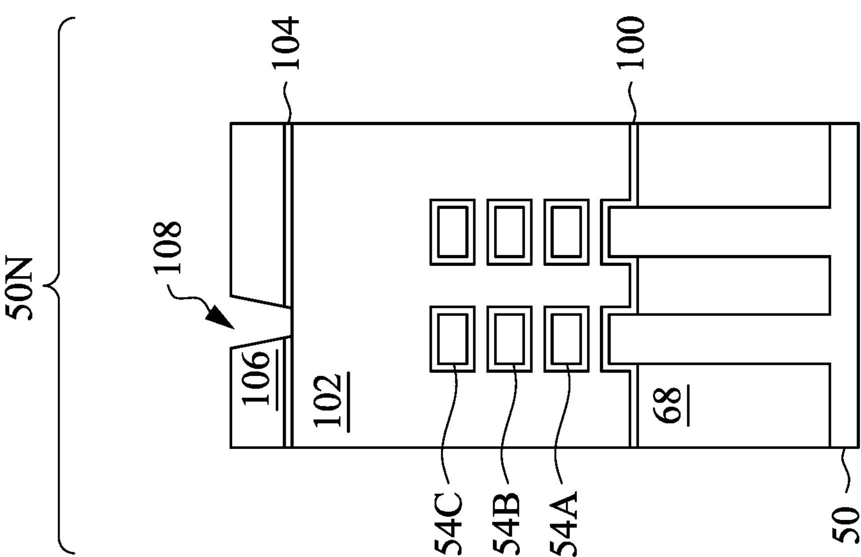
Figure 25B:
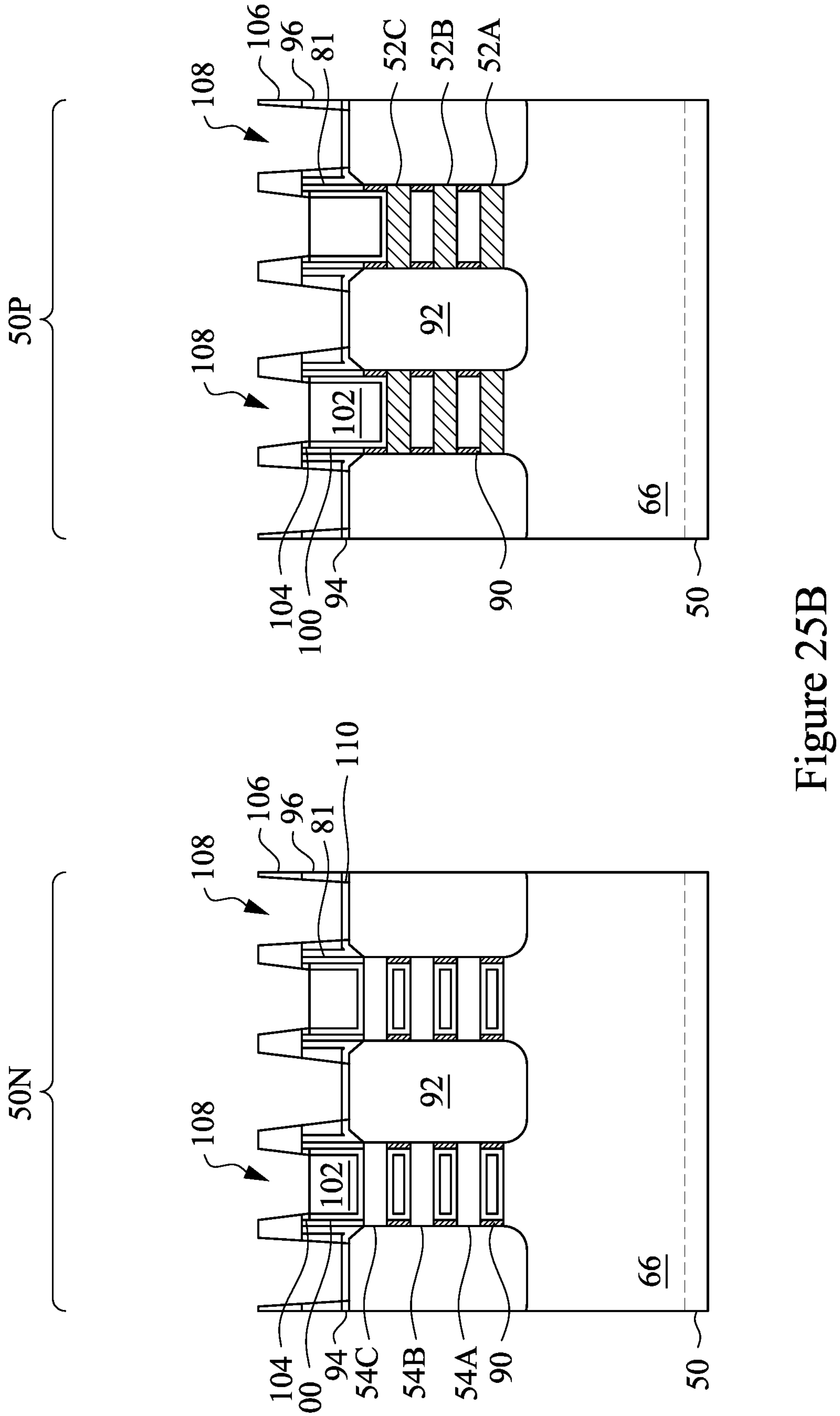
Figure 25C:
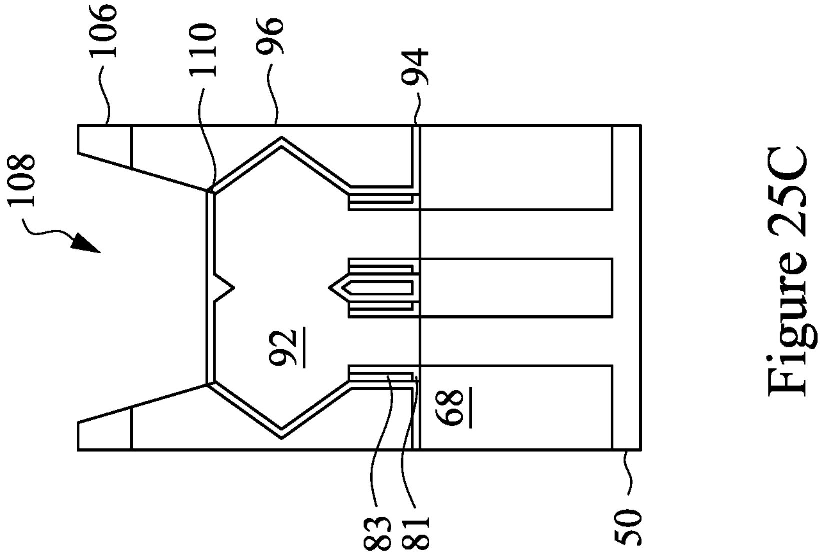

In FIGS. 25A-25C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 25B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 26A:
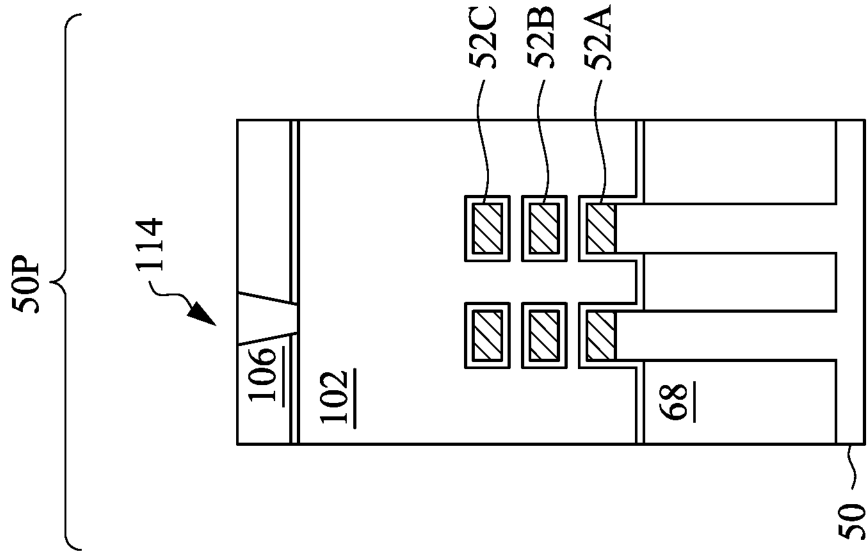
Figure 26A:
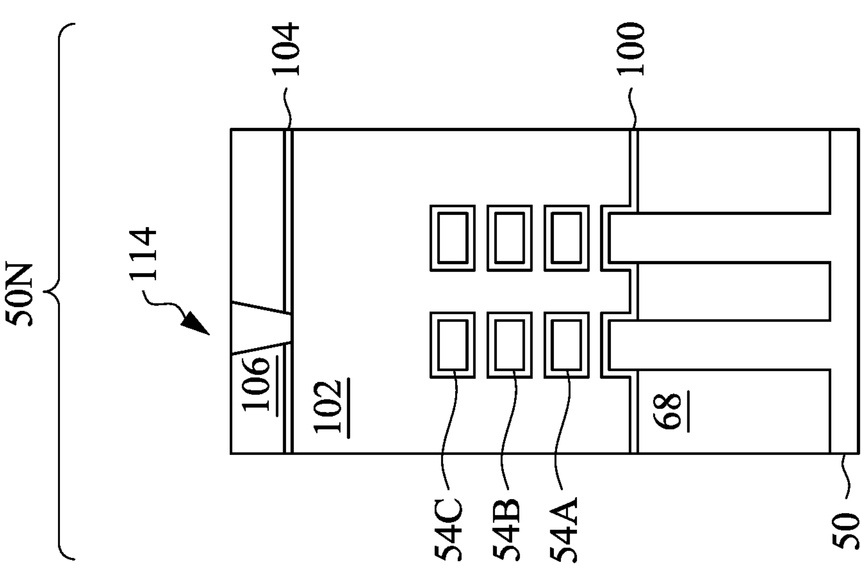
Figure 26B:
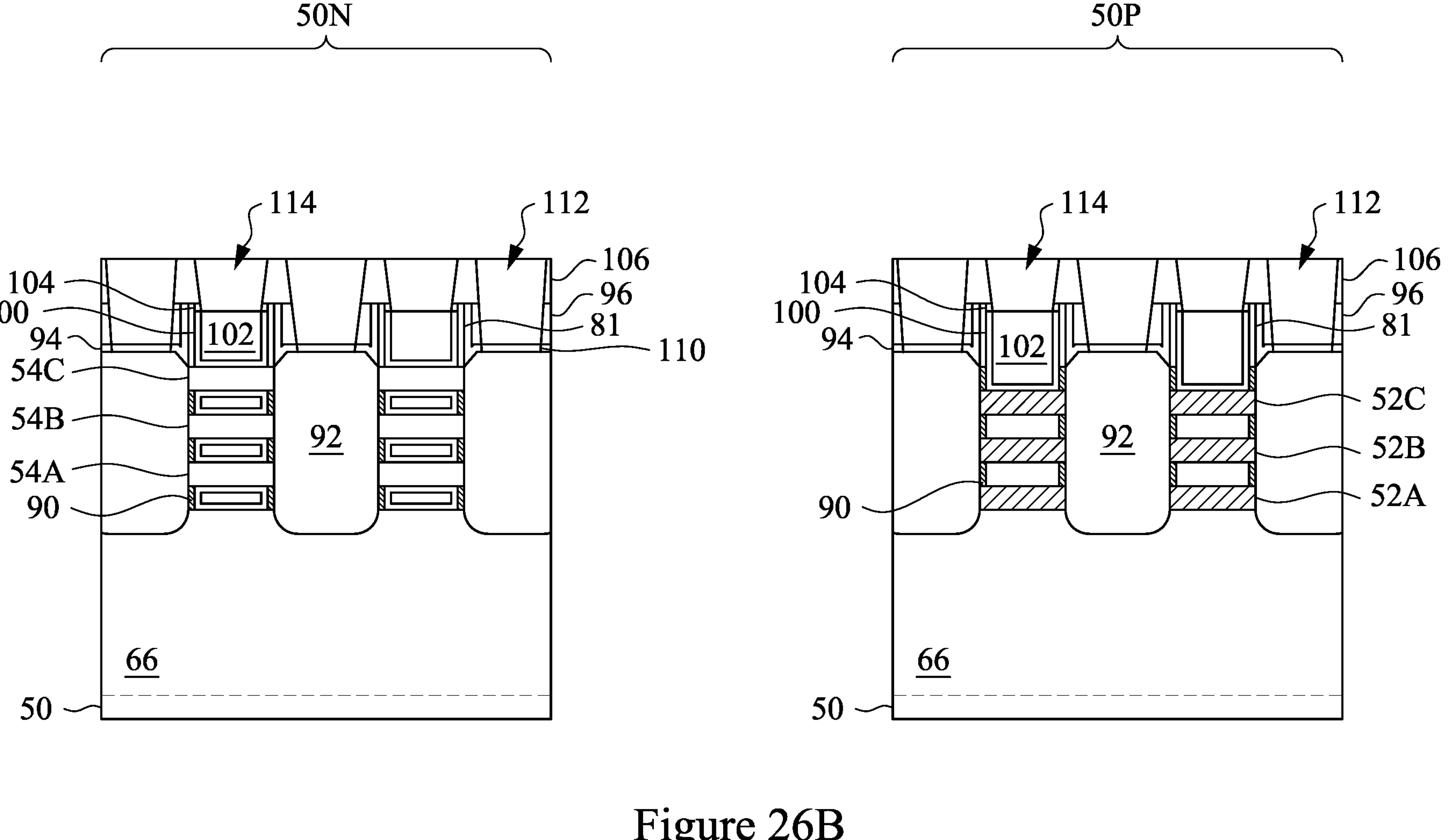
Figure 26C:
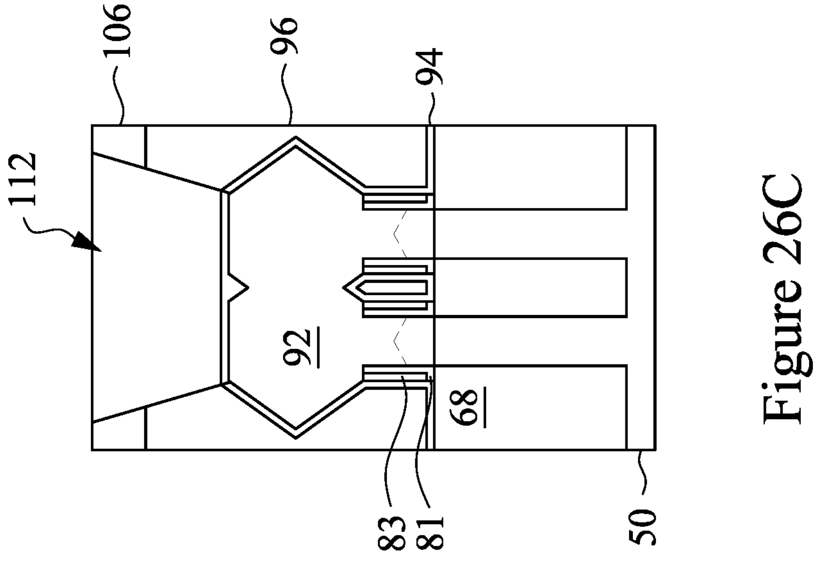
Figure 27A:
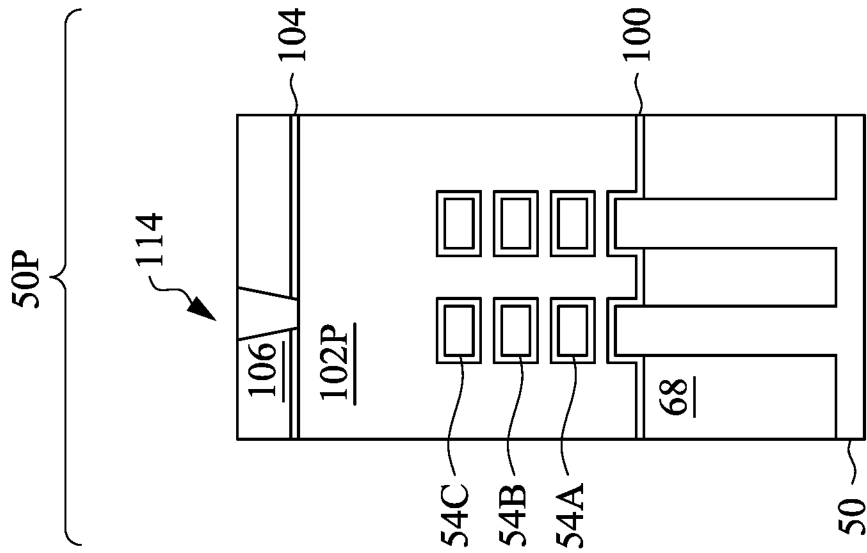
FIGS. 27A, 27B, and 27C are cross-sectional views of a nano-FET, in accordance with some embodiments.
Figure 27A:
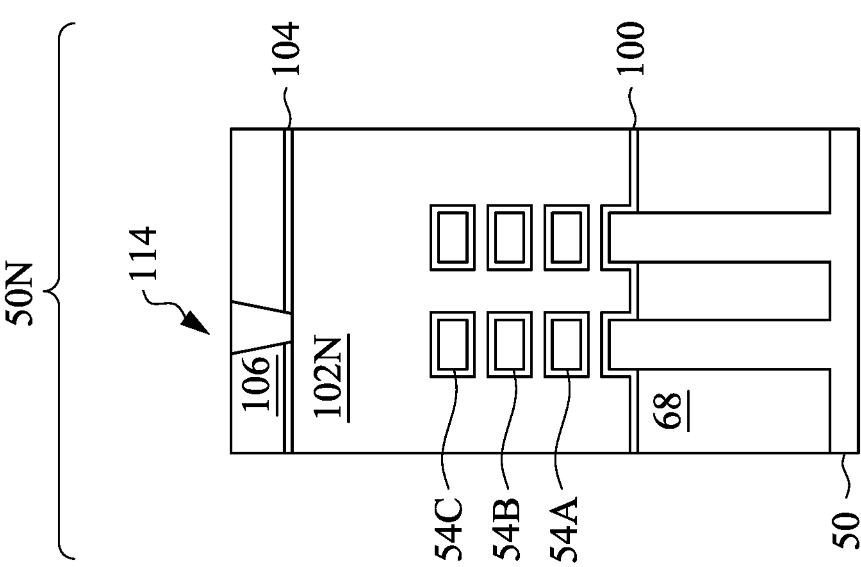
Figure 27B:
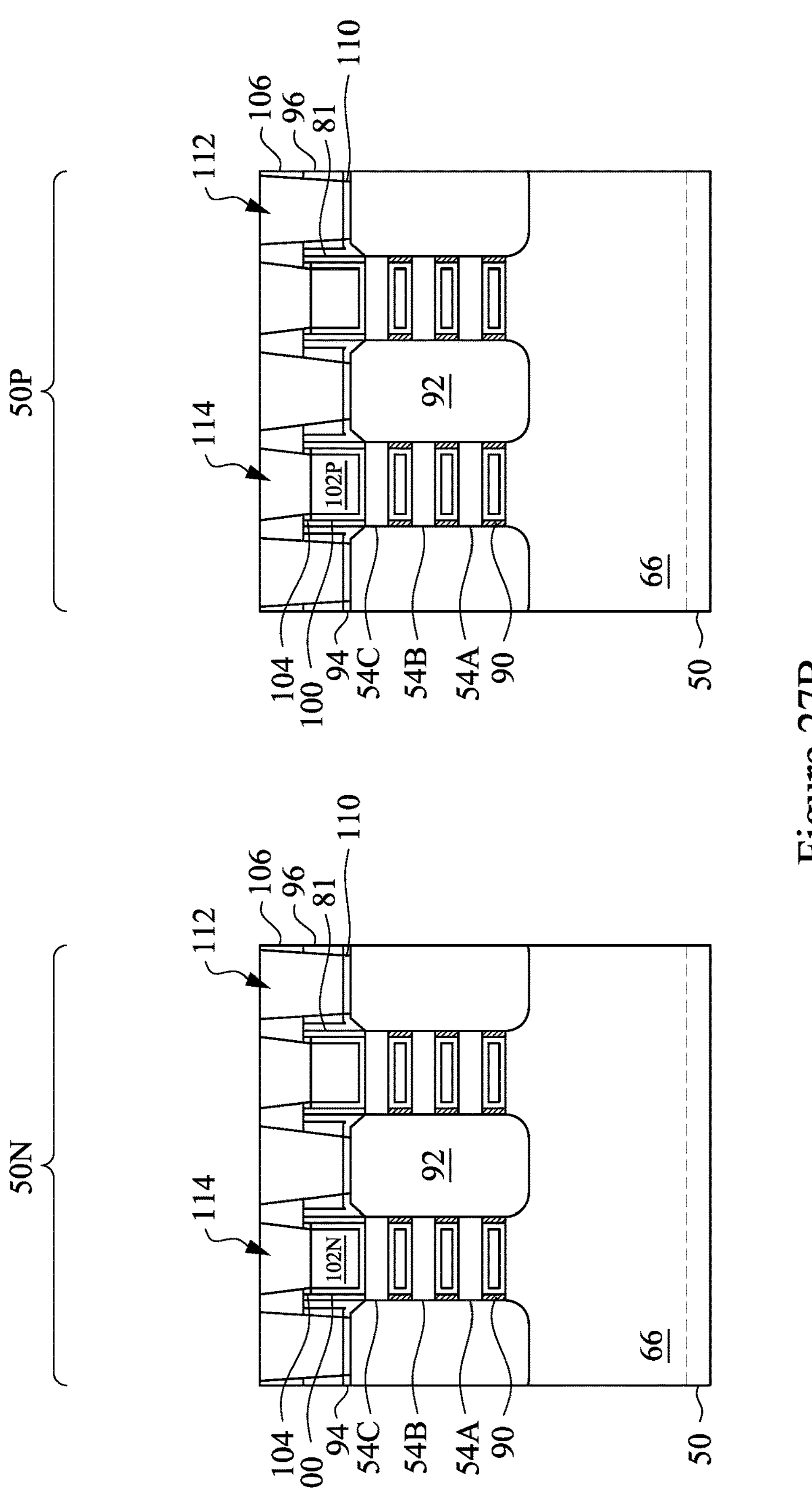
Figure 27C:
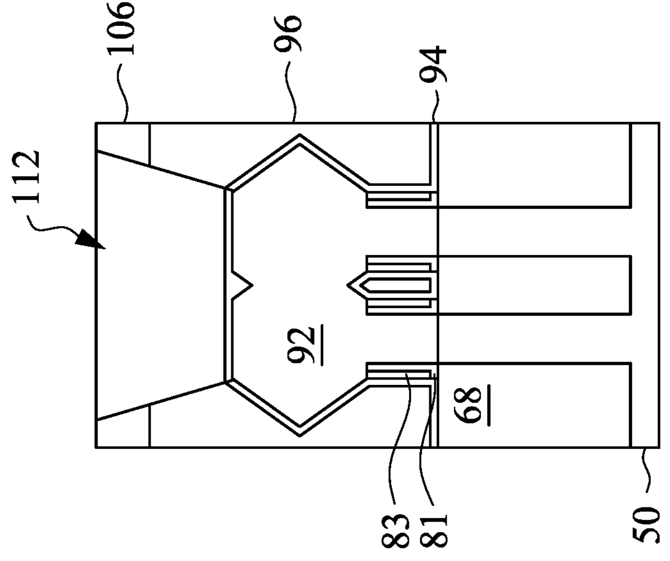

Next, in FIGS. 26A-26C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive fill material, and is electrically coupled to the underlying conductive feature (e.g., gate electrodes 102 and/or silicide region 110 in the illustrated embodiment). The contacts 114 are electrically coupled to the gate electrodes 102 and may be referred to as gate contacts, and the contacts 112 are electrically coupled to the silicide regions 110 and may be referred to as source/drain contacts. The barrier layer for the contacts 112 and 114 may include titanium, titanium nitride, tantalum, tantalum nitride, or the like. The conductive fill material for the contacts 112 and 114 may be copper, a copper alloy, silver, gold, tungsten, cobalt, aluminum, nickel, or the like. A planarization process, such as a CMP, may be performed to remove excess material from a surface of the second ILD 106.

FIGS. 27A-27C illustrate cross-sectional views of a device according to some alternative embodiments. FIG. 27A illustrates reference cross-section A-A' illustrated in FIG. 1. FIG. 27B illustrates reference cross-section B-B' illustrated in FIG. 1. FIG. 27C illustrates reference cross-section C-C' illustrated in FIG. 1. In FIGS. 27A-27C, like reference numerals indicate like elements formed by like processes as the structure of FIGS. 26A-26C. However, in FIGS. 27A-27C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 27A-27C may be formed, for example, by forming inner sidewall spacers on the first nanostructures 52 in both the p-type region 50P and the n-type region 50N; performing the seam closing process of FIGS. 13A through 13D on the inner sidewall spacers; removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments may achieve several advantages. For example, the lateral seam which can result from a conformal deposition process of the spacer layer can be healed by expansion and crosslinking resulting from the oxygen radical treatment and crosslinking process. The concentration profile provides better etch conditions for forming the inner spacers from the spacer layer. This reduces the chances of shorting, lowers k-value, and provides better $C_{eff}$ performance of the transistor. Embodiments also infuse oxygen into the spacer layer and provide oxidation of the spacer layer to increase volume and decrease density of the spacer layer. Embodiments also advantageously remove various compounds from the spacer layer including amine groups and methyl groups by conversion into hydroxyl groups, which provide better crosslinking capabilities and more effective insulating properties. Embodiments also produce an airy region where the de-seaming processes occur to provide lower k value in that area and more effective isolation properties overall. The material composition of the spacer layer is altered from the as-deposited state to include a different composition breakdown, which increases oxygen and reduces carbon and nitrogen at the surface of the spacer layer, resulting in a film with a composite etching resistivity so that part of the film can be removed without unnecessarily or inadvertently removing the inner spacers. Embodiments also reduce the dishing profile of the spacer layer, effectively increasing lateral thickness of the inner spacers.

One embodiment is a device including a first nanostructure and a second nanostructure over the first nanostructure. The device also includes a source/drain region adjacent the first nanostructure. The device also includes a gate structure surrounding the first nanostructure and the second nanostructure. The device also includes a first inner spacer interposed between the first nanostructure and the second nanostructure, the first inner spacer interposed between the gate structure and the source/drain region, the first inner spacer having high oxidation on a first side of the first inner spacer, an intensity of oxidation decreasing by a parabolic gradient curve until reaching a second side of the first inner spacer, the first side of the first inner spacer contacting the source/drain region. In an embodiment, the parabolic gradient curve flattens at first lateral depth of the first inner spacer, where the first lateral depth is between 20% and 50% of a total width of the first inner spacer. In an embodiment, the first inner spacer includes SiOCN. In an embodiment, the first inner spacer further includes trace H and/or trace C1. In an embodiment, a material composition of the first inner spacer includes 40% to 60% more oxygen at the first side of the first inner spacer than at the second side of the first inner spacer. In an embodiment, a contact angle of an outer surface of the first inner spacer is between 30 degrees and 45 degrees. In an embodiment, a material composition of the first inner spacer includes C at 5-20%, N at 0-15%, O at 30-70%, and Si at 30-40%. In an embodiment, a length of the first nanostructure in a direction extending from the source/drain region is greater than a vertical distance between the first nanostructure and the second nanostructure. In an embodiment, the first inner spacer has a width between 2 nm and 15 nm.

Another embodiment is a transistor including a first nanostructure over a semiconductor substrate, the first nanostructure including a first end. The transistor also includes a second nanostructure over the first nanostructure, the second nanostructure including a second end. The transistor also includes a spacer interposed between the first end and the second end. The transistor also includes a source/drain region interfacing the first end, the second end, and a first side of the spacer, where an oxygen content gradient of the spacer decreases parabolically from the first side of the spacer in a first direction parallel to a length of the first nanostructure. In an embodiment, the spacer has a detectable closed seam running horizontally from the first side of the spacer. In an embodiment, the second end of the second nanostructure contacts the gate spacer. In an embodiment, a nitrogen content gradient of the spacer increases parabolically from the first side of the spacer in the first direction.

Another embodiment is a method including etching a first recess adjacent a first nanostructure and a second nanostructure, the first nanostructure over the second nanostructure. The method also includes etching, through the first recess, sidewalls of the second nanostructure to form a sidewall recess of the second nanostructure. The method also includes forming a sidewall spacer layer in the sidewall recess and over ends of the first nanostructure, the sidewall spacer layer having a horizontal seam between an upper portion and a lower portion. The method also includes performing an oxygen radical treatment on the sidewall spacer layer, the oxygen radial treatment incorporating oxygen into a first portion of the sidewall spacer layer at a greater rate than at a second portion of the sidewall spacer layer. The method also includes etching the sidewall spacer layer to remove the first portion of the sidewall spacer layer, thereby exposing the ends of the first nanostructure and forming a first sidewall spacer adjacent the second nanostructure. In an embodiment, a k-value of the first sidewall spacer is reduced by 5% to 10% after the oxygen radical treatment. In an embodiment, the oxygen radical treatment increases a volume of the first sidewall spacer by 5% to 20%. In an embodiment, the method further includes: depositing a source/drain region in the first recess; etching an opening over the first nanostructure and the second nanostructure, the opening extending between two opposing gate spacers, the two opposing gate spacers each contacting an upper surface of the first nanostructure; etching to extend the opening to remove the second nanostructure; and depositing a gate structure in the opening and around the first nanostructure, the first sidewall spacer disposed between the gate structure and the source/drain region. In an embodiment, the method further includes crosslinking an upper surface of the horizontal seam with a lower surface of the horizontal seam. In an embodiment, the method further includes altering a contact angle of the first sidewall spacer between 10 degrees and 20 degrees. In an embodiment, the oxygen radical treatment is performed for a time between 5 s and 1800 s.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

etching a first recess adjacent a first nanostructure and a second nanostructure, the first nanostructure over the second nanostructure;

etching, through the first recess, sidewalls of the second nanostructure to form a sidewall recess of the second nanostructure;

forming a sidewall spacer layer in the sidewall recess and over ends of the first nanostructure, the sidewall spacer layer having a horizontal seam between an upper portion and a lower portion;

performing an oxygen radical treatment on the sidewall spacer layer, the oxygen radical treatment incorporating oxygen into a first portion of the sidewall spacer layer at a greater rate than at a second portion of the sidewall spacer layer;

causing an upper surface of the horizontal seam to crosslink with a lower surface of the horizontal seam; and etching the sidewall spacer layer to remove the first portion of the sidewall spacer layer, thereby exposing the ends of the first nanostructure and forming a first sidewall spacer adjacent the second nanostructure.

2. The method of claim 1, wherein a k-value of the sidewall spacer layer is reduced by 5% to 10% after the oxygen radical treatment.

3. The method of claim 1, wherein the oxygen radical treatment increases a volume of the sidewall spacer layer by 5% to 20%.

4. The method of claim 1, further comprising:

depositing a source/drain region in the first recess;

etching an opening over the first nanostructure and the second nanostructure, the opening extending between two opposing gate spacers, the two opposing gate spacers each contacting an upper surface of the first nanostructure;

etching to extend the opening to remove the second nanostructure; and depositing a gate structure in the opening and around the first nanostructure, the first sidewall spacer disposed between the gate structure and the source/drain region.

5. The method of claim 1, further comprising altering a contact angle of the sidewall spacer layer between 10 degrees and 20 degrees.

6. The method of claim 1, wherein the oxygen radical treatment is performed for a time between 5 seconds and 1800 seconds.

7. A method comprising:

forming a first nanostructure, a second nanostructure over the first nanostructure, and a third nanostructure over the second nanostructure;

recessing an end of the second nanostructure to form a sidewall recess;

forming a first inner spacer in the sidewall recess, the first inner spacer comprising a single material layer;

after forming the first inner spacer, forming a source/drain region adjacent the first nanostructure and the third nanostructure, a first side of the first inner spacer physically contacting the source/drain region, wherein after forming the first inner spacer and after forming the source/drain region, the single material layer of the first inner spacer has a high oxidation on the first side of the single material layer of the first inner spacer, an intensity of oxidation in the single material layer of the first inner spacer decreasing by a parabolic gradient curve until reaching a second side of the single material layer of the first inner spacer, wherein the first side of the single material layer of the first inner spacer faces the source/drain region; and forming a gate structure surrounding the third nanostructure, the first inner spacer interposed between the gate structure and the source/drain region.

8. The method of claim 7, wherein the parabolic gradient curve flattens at a first lateral depth of the first inner spacer, wherein the first lateral depth is between 20% and 50% of a total width of the first inner spacer.

9. The method of claim 7, wherein the first inner spacer comprises SiOCN.

10. The method of claim 9, wherein the first inner spacer further comprises trace H or trace Cl.

11. The method of claim 7, wherein a material composition of the first inner spacer comprises 40% to 60% more oxygen at the first side of the first inner spacer than at the second side of the first inner spacer.

12. The method of claim 7, wherein a contact angle of an outer surface of the first inner spacer is between 30 degrees and 45 degrees.

13. The method of claim 7, wherein a material composition of the first inner spacer comprises C at 5-20%, N at 0-15%, O at 30-70%, and Si at 30-40%.

14. The method of claim 7, wherein a length of the first nanostructure in a direction extending from the source/drain region is greater than a distance between the first nanostructure and the second nanostructure.

15. The method of claim 7, wherein the first inner spacer has a width between 2 nm and 15 nm.

16. The method of claim 7, wherein a first surface of the first inner spacer is cross-linked to a second surface of the first inner spacer.

17. A method comprising:

etching a first recess adjacent a first nanostructure, a second nanostructure over the first nanostructure, and a third nanostructure over the second nanostructure;

etching, through the first recess, a sidewall of the second nanostructure to form a sidewall recess;

forming a sidewall spacer layer along a sidewall of the first recess, the sidewall spacer layer being a single material layer, the sidewall spacer layer covering ends of the first nanostructure, the second nanostructure, and the third nanostructure, the sidewall spacer layer having a horizontal seam between an upper portion and a lower portion in the sidewall recess;

after forming the sidewall spacer layer, performing an oxygen radical treatment on the single material layer of the sidewall spacer layer, wherein after performing the oxygen radical treatment, a concentration profile of oxygen in the single material layer of the sidewall spacer layer decreases from a first side to a second side of the single material layer of the sidewall spacer layer;

after performing the oxygen radical treatment, etching the sidewall spacer layer to expose the ends of the first nanostructure and the third nanostructure in the first recess, and forming a first sidewall spacer adjacent the second nanostructure; and after etching the sidewall spacer layer, forming a source/drain region contacting the exposed ends of the first nanostructure and the third nanostructure in the first recess.

18. The method of claim 17, wherein the oxygen radical treatment incorporates oxygen into a first portion of the sidewall spacer layer at a greater rate than at a second portion of the sidewall spacer layer.

19. The method of claim 18, wherein a k-value of the sidewall spacer layer is reduced by 5% to 10% after the oxygen radical treatment.

20. The method of claim 17, wherein the first sidewall spacer has a first surface merged with a second surface to form a closed seam.

* * * * *